United States Patent
Jang et al.

(10) Patent No.: US 9,978,814 B2
(45) Date of Patent: May 22, 2018

(54) ORGANIC LIGHT EMITTING DISPLAY DEVICE

(71) Applicant: LG DISPLAY CO., LTD., Seoul (KR)

(72) Inventors: Jihyang Jang, Goyang-si (KR); KangJu Lee, Goyang-si (KR); SeungRyong Joung, Gimpo-si (KR); Hansun Park, Paju-si (KR); Sookang Kim, Paju-si (KR); Soyoung Jo, Seoul (KR); Seongsu Jeon, Gwangmyeong-si (KR); Wonhoe Koo, Goyang-si (KR); Hyunsoo Lim, Goyang-si (KR); JeaHo Park, Paju-si (KR); Mingeun Choi, Asan-si (KR); Hyunjoo Kim, Seoul (KR); Wooram Youn, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days. days.

(21) Appl. No.: 15/296,941

(22) Filed: Oct. 18, 2016

(65) Prior Publication Data
US 2017/0125489 A1 May 4, 2017

(30) Foreign Application Priority Data

Oct. 30, 2015 (KR) .................. 10-2015-0152630
Aug. 31, 2016 (KR) .................. 10-2016-0112123

(51) Int. Cl.
*H01L 27/32* (2006.01)
*H01L 51/52* (2006.01)
*H01L 51/56* (2006.01)

(52) U.S. Cl.
CPC ...... *H01L 27/3213* (2013.01); *H01L 27/3272* (2013.01); *H01L 51/5275* (2013.01); *H01L 51/56* (2013.01)

(58) Field of Classification Search
CPC .. H01L 27/32; H01L 27/3213; H01L 27/3272
See application file for complete search history.

(56) References Cited

U.S. PATENT DOCUMENTS

| | | | |
|---|---|---|---|
| 7,144,752 B2 | 12/2006 | Yotsuya | |
| 7,659,662 B2 | 2/2010 | Song et al. | |
| 7,928,639 B2 | 4/2011 | Adachi | |
| 8,643,819 B2 * | 2/2014 | Yamamoto | G02F 1/133514 349/106 |

(Continued)

FOREIGN PATENT DOCUMENTS

| | | |
|---|---|---|
| CN | 196 7899 A | 5/2007 |
| CN | 106486525 A | 3/2017 |

(Continued)

*Primary Examiner* — Phuc Dang
(74) *Attorney, Agent, or Firm* — Seed Intellectual Property Law Group LLP

(57) ABSTRACT

An organic light-emitting display device. A substrate is divided into a plurality of subpixels generating different colors of light. A light leakage prevention layer is disposed on a portion of the substrate corresponding to a light-emitting area of at least one subpixel of the plurality of subpixels. An overcoat layer is disposed on a portion of the substrate corresponding to at least one subpixel of the plurality of subpixels, and includes microlenses having a plurality of concave portions or a plurality of convex portions. An organic electroluminescent device is disposed on the overcoat layer.

22 Claims, 17 Drawing Sheets

(56) References Cited

U.S. PATENT DOCUMENTS

| | | | |
|---|---|---|---|
| 9,620,570 B2 | 4/2017 | Koo et al. | |
| 2011/0160329 A1* | 6/2011 | Kim | G03F 7/0007 |
| | | | 522/149 |
| 2014/0084259 A1* | 3/2014 | Kim | H01L 51/5237 |
| | | | 257/40 |
| 2014/0138630 A1 | 5/2014 | Lee et al. | |
| 2015/0084026 A1* | 3/2015 | Miyamoto | H01L 27/322 |
| | | | 257/40 |
| 2015/0380466 A1 | 12/2015 | Koo et al. | |
| 2016/0019854 A1* | 1/2016 | Liu | G09G 3/3648 |
| | | | 345/204 |
| 2016/0064694 A1* | 3/2016 | Choi | H01L 51/5275 |
| | | | 257/40 |
| 2016/0203772 A1* | 7/2016 | Nakanishi | G09G 3/2003 |
| | | | 345/694 |

FOREIGN PATENT DOCUMENTS

| | | |
|---|---|---|
| CN | 106784362 A | 5/2017 |
| JP | 2004-363049 A | 12/2004 |
| JP | 2006-244999 A | 9/2006 |
| JP | 2007-207656 A | 8/2007 |
| JP | P2012 252984 A | 12/2012 |
| JP | 2014-48646 A | 3/2014 |
| KR | 10-2014-0019186 A | 3/2004 |
| KR | 1020130120862 A | 11/2013 |
| KR | 2015 0077279 A | 7/2015 |
| KR | 1020150077261 A | 7/2015 |
| KR | 2015 0121896 A | 10/2015 |
| KR | 10-2016-0001260 A | 1/2016 |
| KR | 2016 0029491 A | 3/2016 |
| TW | I275320 B | 3/2007 |

* cited by examiner

ORGANIC LIGHT EMITTING DISPLAY DEVICE

CROSS REFERENCE TO RELATED APPLICATION

This application claims priority from Korean Patent Application Number 10-2015-0152630, filed Oct. 30, 2015; and Korean Patent Application Number 10-2016-0112123, filed Aug. 31, 2016, which are hereby incorporated by reference for all purposes as if fully set forth herein.

BACKGROUND

Technical Field

The present disclosure generally relates to an organic light-emitting display device and, more particularly, to an organic light-emitting display device able to prevent light leakage.

Description of Related Art

Organic light-emitting display devices can be fabricated to be relatively light and thin, since organic electroluminescent (EL) devices or organic light-emitting diodes (OLEDs) able to emit light themselves are used therein and a separate light source is not required. In addition, organic light-emitting display devices are not only advantageous in terms of power consumption, since they are driven at low voltages, but also have desirable qualities, such as the ability to implement a range of colors, rapid response rates, wide viewing angles, and high contrast ratios. Thus, organic light-emitting display devices for next-generation displays have been actively researched.

Light generated by an organic light-emitting layer of an organic light-emitting display device is emitted from the organic light-emitting display device through several components of the organic light-emitting display device. However, a portion of light generated by the organic light-emitting layer may fail to exit the organic light-emitting display device and may be trapped therewithin, thereby causing a problem of low light extraction efficiency in the organic light-emitting display device.

Specifically, in the case of an organic light-emitting display device having a bottom emission structure, about 50% of light generated by the organic light-emitting layer may be trapped within the organic light-emitting display device through total internal reflection or light absorption by an anode electrode while about 30% of light generated by the organic light-emitting layer may be trapped within the organic light-emitting display device through total internal reflection or light absorption by a substrate. That is, about 80% of light generated by the organic light-emitting layer may be trapped within the organic light-emitting display device, and only about 20% of light may be emitted outwardly, leading to poor light extraction efficiency.

To improve the light extraction efficiency of organic light-emitting display devices, an approach of attaching a microlens array (MLA) to an overcoat layer of an organic light-emitting display device or an approach of forming microlenses on an overcoat layer of an organic light-emitting display device has been proposed.

When the MLA is disposed outside of a substrate of the organic light-emitting display device or the microlenses are formed on the overcoat layer, light generated by the organic light-emitting layer arrives at a polarizer through the substrate and is then reflected from the polarizer to be redirected toward the substrate. Here, a portion of light traveling toward the substrate may arrive at a microlens of an adjacent pixel on which a different color of light is generated, thereby causing light leakage, which is problematic.

BRIEF SUMMARY

Various aspects of the present disclosure provide an organic light-emitting display device able to prevent light leakage while improving light extraction efficiency.

In an aspect of the present disclosure, an organic light-emitting display device may include: a substrate divided into a plurality of subpixels generating different colors of light; a light leakage prevention layer disposed on a portion of the substrate corresponding to a light-emitting area of at least one subpixel of the plurality of subpixels; an overcoat layer disposed on a portion of the substrate corresponding to at least one subpixel of the plurality of subpixels, and including microlenses having a plurality of concave portions or a plurality of convex portions; and an organic electroluminescent device disposed on the overcoat layer.

The plurality of subpixels may be divided into red, green, blue, and white subpixels. The light leakage prevention layer may include first to fourth light leakage prevention layers disposed in the plurality of subpixels, respectively. At least two light leakage prevention layers of the first to fourth light leakage prevention layers may allow an identical color of light to pass therethrough. Alternatively, at least one light leakage prevention layer of the first to fourth light leakage prevention layers may allow at least one color of light complementary to at least one color of light passing through remaining light leakage prevention layers of the first to third light leakage prevention layers to pass therethrough.

The microlenses may include first microlenses and second microlenses disposed in at least one subpixel of the plurality of subpixels in which the first microlenses are not disposed, the second microlenses being identical to or different from the first microlenses. The microlenses may further include third microlenses identical to the first microlenses or the second microlenses or different from the first microlenses and the second microlenses.

In the organic light-emitting display device, the light leakage prevention layer may not be disposed in at least one subpixel of the plurality of subpixels. The first microlenses may not be disposed in at least one subpixel of the plurality of subpixels.

According to the present disclosure as set forth above, the organic light-emitting display device includes a light leakage prevention layer disposed in an area corresponding to a light-emitting area in at least one subpixel of a plurality of subpixels to prevent or reduce light leakage between different subpixels or different pixels while preventing the extraction efficiency of light generated by an organic luminescent (EL) device from being reduced.

In addition, in the organic light-emitting display device according to the present disclosure, each of a plurality of pixels includes a plurality of subpixels, in which the plurality of subpixels include different microlenses or at least one subpixel of the plurality of subpixels is not provided with microlenses, whereby light extraction efficiency can be adjusted depending on the subpixels and light leakage can be prevented.

BRIEF DESCRIPTION OF THE SEVERAL VIEWS OF THE DRAWINGS

The above and other objects, features and advantages of the present disclosure will be more clearly understood from the following detailed description when taken in conjunction with the accompanying drawings, in which.

DETAILED DESCRIPTION

Figure 1:
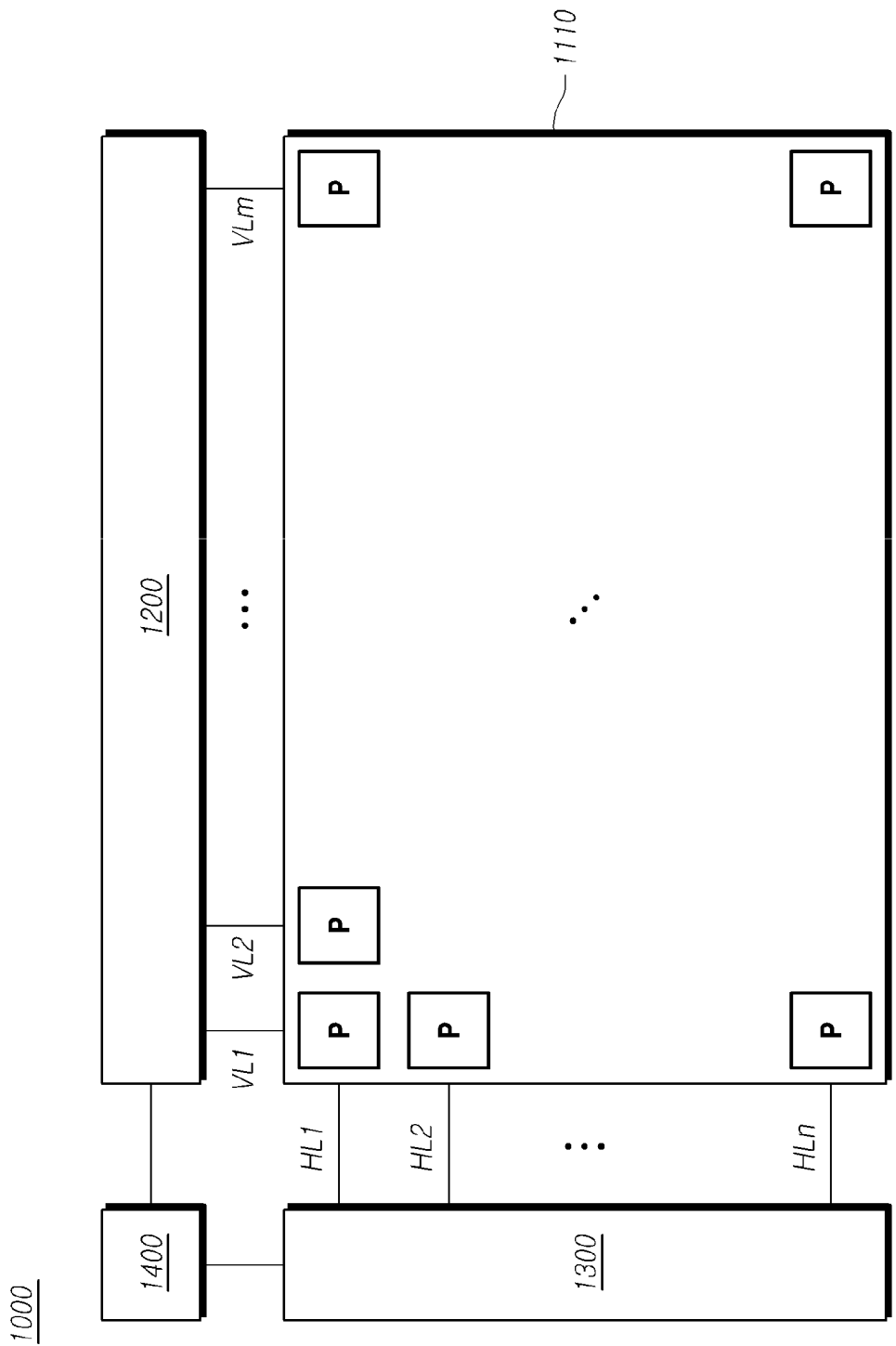
FIG. 1 is a block diagram schematically illustrating a display device according to exemplary embodiments.

Reference will now be made in detail to embodiments of the present disclosure, examples of which are illustrated in the accompanying drawings. The embodiments set forth herein are provided for illustrative purposes to fully convey the concept of the present disclosure to a person skilled in the art. The present disclosure should not be construed as being limited to these embodiments and may be embodied in many different forms. In the drawings, the size and thickness of the device may be exaggerated for the sake of clarity. Throughout this document, the same reference numerals and symbols will be used to designate the same or like components.

The advantages and features of the present disclosure and methods of the realization thereof will be apparent with reference from the accompanying drawings and detailed descriptions of the embodiments. The present disclosure should not be construed to be limited to the embodiments set forth herein and may be embodied in many different forms. Rather, these embodiments are provided so that the present disclosure will be thorough and complete, and will fully convey the scope of the present disclosure to a person skilled in the art. The scope of the present disclosure shall be defined by the appended Claims. Throughout this document, the same reference numerals and symbols will be used to designate the same or like components. In the drawings, the sizes and relative sizes of layers and areas may be exaggerated for the sake of clarity.

It will be understood that when an element or a layer is referred to as being "on" another element or layer, not only can it be "directly on" the other element or layer, but it can also be "indirectly on" the other element or layer via an "intervening" element or layer. In contrast, when an element or a layer is referred to as being "directly on" another element or layer, it will be understood that no intervening element or layer is interposed.

Spatially relative terms such as "below," "beneath," "under," "lower," "above," and "upper" may be used herein for the ease of description of the relationship of an element or components to another element or other components as illustrated in the drawings. The spatially relative terms should be construed as terms encompassing different orientations of the element in use or operation in addition to the orientation depicted in the drawings. For example, when elements illustrated in the drawings are turned over, an element described as "below," "beneath," or "under" another element would then be oriented "above" the other element. Thus, the example term "below," "beneath," or "under" can encompass both orientations of above and below.

In addition, terms such as "first," "second," "A," "B," "(a)," and "(b)" may be used herein to describe the components. It should be understood, however, that these terms are only used to distinguish one component from another component and the substance, order, sequence, or number of the components is not limited by these terms.

FIG. 1 is a block diagram schematically illustrating a display device according to exemplary embodiments. Referring to FIG. 1, the display device 1000 according to exemplary embodiments includes: a display panel 1100 on which a plurality of first lines VL1 to VLm are arranged in a first direction, i.e., a vertical direction in the drawing, and a plurality of second lines HL1 to HLn are arranged in a second direction, i.e., a horizontal direction in the drawing; a first driver circuit 1200 supplying first signals to the plurality of first lines VL1 to VLm; a second driver circuit 1300 supplying second signals to the plurality of second lines HL1 to HLn; and a timing controller 1400 controlling the first driver circuit 1200 and the second driver circuit 1300.

A plurality of pixels P are defined on the display panel 1100, through the intersection of the plurality of first lines VL1 to VLm arranged in the first direction and the plurality of second lines HL1 to HLn arranged in the second direction.

Each of the first driver circuit 1200 and the second driver circuit 1300 may include at least one driver integrated circuit (IC) to output image display signals.

The plurality of first lines VL1 to VLm arranged on the display panel 1100 in the first direction may be, for example, data lines arranged in the vertical direction to deliver data voltages (i.e., first signals) to pixel columns arranged in the vertical direction. The first driver circuit 1200 may be a data driver circuit supplying data voltages to the data lines.

In addition, the plurality of second lines HL1 to HLn arranged on the display panel 1100 in the second direction may be, for example, gate lines arranged in the horizontal direction to deliver scanning signals (i.e., second signals) to pixel rows arranged in the horizontal direction. The second driver circuit may be a gate driver supplying scanning signals to the gate lines.

The display panel 1100 has pads disposed thereon, the pads allowing the display panel 1100 to be connected to the first driver circuit 1200 and the second driver circuit 1300. When the first driver circuit 1200 supplies first signals to the plurality of first lines VL1 to VLm, the pads deliver the first signals to the display panel 1100. In the same manner, when the second driver circuit 1300 supplies second signals to the plurality of second lines HL1 to HLn, the pads deliver the second signals to the display panel 1100.

Each of the pixels includes one or more subpixels. Colors defined by the subpixels may be red (R), green (G), blue (B), and selectively, white (W), but the present disclosure is not limited thereto.

In the display panel, an electrode connected to a thin-film transistor (TFT) controlling each of the subpixels to generate light is referred to as a first electrode, while an electrode disposed on the front surface of the display panel or covering two or more pixels is referred to as a second electrode. When the first electrode is an anode, the second electrode is a cathode, and vice versa. Hereinafter, the first electrode will be referred to as the anode and the second electrode will be referred to as the cathode, but the present disclosure is not limited thereto.

The organic light-emitting display device may be categorized as a top emission type or a bottom emission type depending on the structure of an electroluminescent device. Although the following embodiments will be described with respect to the bottom emission type organic light-emitting display device, the present disclosure is not limited thereto.

Each of the subpixels will be a base on which a color filter having a single color is disposed or is not disposed. The color filter converts the color of a single organic light-emitting layer to a specific wavelength of color. In addition, a light-scattering layer may be disposed in each of the subpixel to improve the light extraction efficiency of the organic light-emitting layer. The light-scattering layer may be referred to as a microlens array, a nano-pattern, a diffuse pattern, silica beads, or the like.

Hereinafter, embodiments of the scattering layer will be described with respect to a microlens array. However, exemplary embodiments of the present disclosure are not limited thereto, and a variety of structures for scattering light may be combined therewith.

Figure 2:
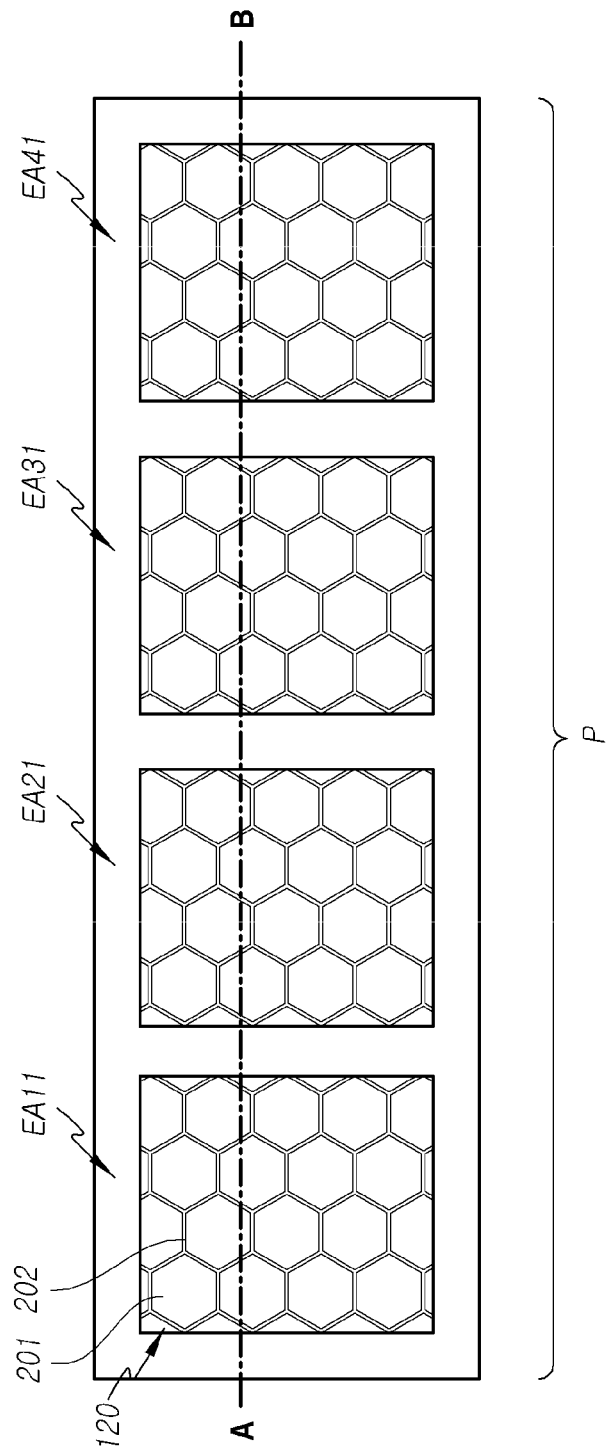
FIG. 2 is a plan view illustrating an organic light-emitting display device according to a first exemplary embodiment.

Hereinafter, an organic light-emitting display device according to a first exemplary embodiment will be described with reference to FIG. 2. FIG. 2 is a plan view illustrating the organic light-emitting display device according to the first exemplary embodiment.

Referring to FIG. 2, in the organic light-emitting display device according to the first exemplary embodiment, a single pixel P includes a plurality of subpixels. Specifically, a single pixel P may include four (4) subpixels. In the following exemplary embodiments, a single pixel P will be described as including four subpixels. However, the exemplary embodiments are not limited thereto and may comprehensively include all configurations in which a single pixel P includes two (2) to four (4) subpixels.

The plurality of subpixels (e.g., four subpixels) include light-emitting areas EA11, EA21, EA31, and EA41, respectively. For example, the first subpixel includes the first light-emitting area EA11, the second subpixel includes the second light-emitting area EA21, the third subpixel includes the third light-emitting area EA31, and the fourth subpixel includes the fourth light-emitting area EA41.

Although the first to fourth light-emitting areas EA11, EA21, EA31, and EA41 may be areas from which red (R), green (G), blue (B), and white wavelength ranges of light are emitted, exemplary embodiments are not limited thereto. Rather, a configuration in which at least two light-emitting areas of the four light-emitting areas EA11, EA21, EA31, and EA41 emit different colors of light may be employed in accordance with embodiments of the present disclosure.

A plurality of microlenses are disposed in each of the light-emitting areas EA11, EA21, EA31, and EA41. The shapes of the microlenses disposed in the light-emitting areas EA11, EA21, EA31, and EA41 may be the same. The microlenses may improve external light extraction efficiency of organic EL devices. The plurality of microlenses include a plurality of first recesses 201 and a plurality of first connecting portions 202 formed in an overcoat layer 120, each of the plurality of first connecting portions 202 connecting adjacent first recesses 201.

The microlenses having the same shape are arranged in the first to fourth light-emitting areas EA11, EA21, EA31, and EA41. This configuration will now be described with reference to FIG. 3.

Figure 3:
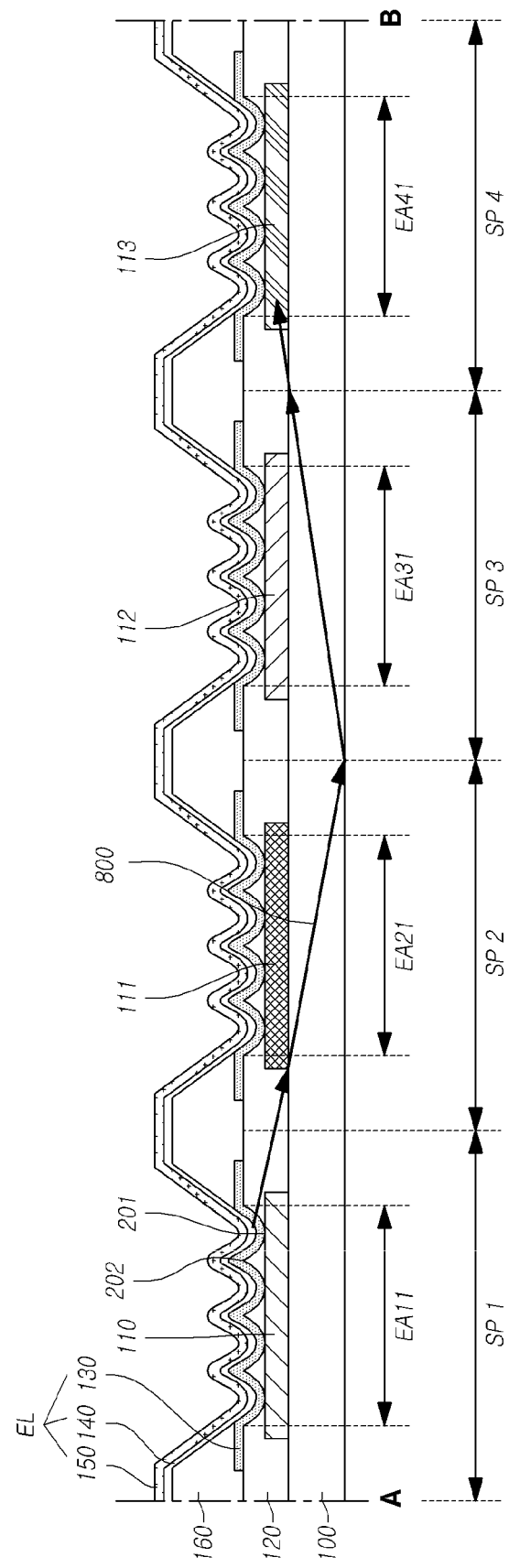
FIG. 3 is a cross-sectional view of the organic light-emitting display device according to the first exemplary embodiment, taken along line A-B in FIG. 2.

FIG. 3 is a cross-sectional view of the organic light-emitting display device according to the first exemplary embodiment, taken along line A-B in FIG. 2. Referring to FIG. 3, the organic light-emitting display device according to the first exemplary embodiment includes first to fourth subpixels SP1, SP2, SP3, and SP4.

When light generated by the EL device travels toward the substrate 100, a portion of light may arrive at the microlenses of an adjacent subpixel generating a different color of light or the microlenses of another adjacent pixel, thereby causing light leakage. Specifically, when a display device is provided with subpixels having no color filters, a significant amount of a light leakage component generated by the other subpixels may arrive at microlenses of the subpixels having no color filters, which may thus cause the light leakage component to be visually perceived. In particular, when a color filter is not disposed in a white (W) subpixel, a light leakage component generated by another subpixel may arrive at microlenses of the white subpixel and may be visually perceived by viewers, which is problematic.

To overcome this problem, the organic light-emitting display device according to the first exemplary embodiment includes light leakage prevention layers 110, 111, 112, and 113 disposed on a substrate 100 divided into the first to fourth subpixels SP1 to SP4. Specifically, the first light leakage prevention layer 110 is disposed on the first subpixel SP1, the light leakage prevention layer 111 is disposed on the second subpixel SP2, the third light leakage prevention layer 112 is disposed on the third subpixel SP3, and the fourth light leakage prevention layer 113 is disposed on the fourth subpixel SP4.

The overcoat layer 120 is disposed on the substrate 100 including the first to fourth light leakage prevention layers 110 to 113. An organic electroluminescent device EL including a first electrode 130, an organic light-emitting layer 140, and a second electrode 150 is disposed on the overcoat layer 120.

The organic electroluminescent device EL includes microlenses to improve external light extraction efficiency in the light-emitting areas EA11, EA21, EA31, and EA41. The light-emitting areas EA11, EA21, EA31, and EA41 are defined between edges of a bank pattern 160 that is configured to expose predetermined portions of the top surface of the first electrode 130.

Specifically, the overcoat layer 120 includes a plurality of microlenses in each of the light-emitting areas EA11, EA21, EA31, and EA41. The plurality of microlenses are comprised of the plurality of first recesses 201 and the plurality of connecting portions 202, each of the connecting portions connecting adjacent first recesses 201. When the organic electroluminescent device EL includes the plurality of microlenses in the light-emitting areas EA11, EA21, EA31, and EA41, the plurality of recesses 201 formed in the overcoat layer 120 impart the surface of the organic electroluminescent device EL with concave curve portions, due to the characteristics of the pattern.

The first to fourth light leakage prevention layers 110 to 113 are disposed in areas corresponding to the light-emitting areas EA11, EA21, EA31, and EA41 of the first to fourth subpixels SP1 to SP4. With this configuration, the organic light-emitting display device according to the first exemplary embodiment can prevent or reduce light leakage between different subpixels. Here, the first to fourth light leakage prevention layers 110 to 113 can allow specific wavelengths of light to pass therethrough while absorbing the remaining wavelengths of light. In addition, at least one light leakage prevention layer among the first to fourth light leakage prevention layers 110 to 113 is thinner than the other light leakage prevention layers to improve the light transmittance thereof to be higher than those of the other light leakage prevention layers.

Describing the principle of preventing light leakage in detail, using the first to fourth light leakage prevention layers 110 to 113, the refractive index of the first electrode 130 and the organic light-emitting layer 140 of the organic electroluminescent device EL may be higher than the refractive index of the substrate 100 and the overcoat layer 120. For example, the refractive index of the substrate 100 and the overcoat layer 120 is about 1.5, while the refractive index of the first electrode 130 and the organic light-emitting layer 140 of the organic electroluminescent device EL is in the range of 1.7 to 2.0.

A portion of light 800 generated by the organic light-emitting layer 140 is reflected from the second electrode 150 and is redirected toward the first electrode 130, while the remaining portions of light generated by the organic light-emitting layer 140 are emitted toward the first electrode 130. That is, most of light generated by the organic light-emitting layer 140 is directed toward the first electrode 130.

Since the refractive index of the organic light-emitting layer 140 is substantially equal to the refractive index of the first electrode 130, the path of light generated by the organic light-emitting layer 140 is not changed at the boundary between the organic light-emitting layer 140 and the first electrode 130. Due to the difference in the refractive indices between the first electrode 130 and the overcoat layer 120, light that has passed through the first electrode 130 can be totally reflected at the boundary between the first electrode 130 and the overcoat layer 120 when incident at an angle equal to or greater than a threshold angle.

In this case, light totally reflected at the boundary between the first electrode 130 and the overcoat layer 120 is re-reflected from the second electrode 150 and passes through the organic light-emitting layer 140 and the first electrode 130 and then through the substrate 100, the refractive index of which is substantially the same as the refractive index of the overcoat layer 120, to arrive at a polarizer (not shown) disposed on the rear surface of the substrate 100. The light is then reflected from the polarizer (not shown) to be redirected toward the substrate 100.

In addition, in the organic light-emitting display device according to the first exemplary embodiment, the first to fourth light leakage prevention layers 110 to 113 are disposed on the substrate 100, more particularly, in the areas corresponding to the light-emitting areas EA11, EA21, EA31, and EA41, to prevent light traveling at an angle greater than the total reflection threshold angle from arriving at the microlenses of another adjacent subpixel or another adjacent pixel.

Specifically, light 800 generated by the organic light-emitting layer 140 is totally reflected at the boundary between the first electrode 130 and the overcoat layer 120 and is then reflected from the second electrode 150 to be redirected toward the substrate 100. In this case, a portion of light 800 traveling at an angle greater than the total reflection threshold angle passes through the overcoat layer 120 and the substrate 100 and is then re-reflected at the boundary between the substrate 100 and the polarizer (not shown) to be redirected toward the substrate 100.

Afterwards, the portion of light redirected toward the substrate 100 passes through the substrate 100 once more to arrive at one of the first to fourth light leakage prevention layers 110 to 113 disposed on the substrate 100. When the portion of light arrives at one of the first to fourth light leakage prevention layers 110 to 113, the portion of light is absorbed thereby. Since light generated by different subpixels or different pixels is absorbed by the light leakage prevention layers as described above, light leakage from the organic light-emitting display device including a plurality of microlenses can be prevented or reduced.

Since the first to fourth light leakage prevention layers 110 to 113 according to the present embodiment are characterized by allowing specific wavelengths of light to pass therethrough while absorbing the remaining wavelengths of light, the first to fourth light leakage prevention layers 110 to 113 can allow specific wavelengths of light among light leakage components to pass therethrough while absorbing the remaining wavelengths of light among the light leakage components. For example, the fourth light leakage prevention layer 113 may allow blue light B to pass therethrough and is disposed in the fourth subpixel SP4, in which case the fourth light leakage prevention layer 113 allows a light leakage component having a blue wavelength range of light to pass therethrough while absorbing light having the remaining wavelength ranges. In this case, bluish light can be emitted from the fourth subpixel SP4. In the case of a display device in which the efficiency of blue light is low, this can consequently compensate for blue light.

In addition, at least two light leakage prevention layers among the first to fourth light leakage prevention layers 110 to 113 can allow the same color of light to pass therethrough. For example, the first light leakage prevention layer 110, the second light leakage prevention layer 111, and the third light leakage prevention layer 112 allow different colors of light to pass therethrough, while the fourth light leakage prevention layer 113 allows the same color of light to pass therethrough as the color of light that the first to third light leakage prevention layers 110, 111, and 112 allow to pass therethrough.

More specifically, in one or more embodiments, the first light leakage prevention layer 110 allows red (R) light to pass therethrough, the second light leakage prevention layer 111 allows green (G) light to pass therethrough, and the third light leakage prevention layer 112 allows blue (B) light to pass therethrough, while the fourth light leakage prevention layer 113 allows one of red light, green light, and blue light to pass therethrough. The fourth light leakage prevention layer 113 is configured to be thinner than any one of the first to third light leakage prevention layers 110, 111, and 112 to be able to not only allow one of red light, green light, and blue light but also to allow the other visible light to pass therethrough. Here, the transmittance of each of the first to third light leakage prevention layers 110, 111, and 112 for a specific wavelength range of light may be 60% or more, while the transmittance of the fourth light leakage prevention layer 113 for visible light may be 60% or more. Each of the first to third light leakage prevention layers 110, 111, and 112 allows a color of light to pass therethrough while absorbing the other colors of light.

When the first light leakage prevention layer 110 and the fourth light leakage prevention layer 113 allow the same color of light to pass therethrough and a leakage light component generated by the second subpixel SP2 or the third subpixel SP3 is directed toward the fourth subpixel SP4, the leakage light component is absorbed by the fourth light leakage prevention layer 113. This can prevent light leakage between different subpixels or different pixels. In addition, since the fourth light leakage prevention layer 113 is configured to be thinner than any one of the first to third light leakage prevention layers 110, 111, and 112, the transmittance of visible light of the fourth light leakage prevention layer 113 can be relatively high. Since the fourth subpixel SP4 is provided with the relatively-thin fourth light leakage prevention layer 113, the fourth subpixel SP4 can have a higher level of light transmittance than the other subpixels while being able to prevent light leakage.

In addition, when a green or blue leakage light component generated by the second subpixel SP2 or the third subpixel SP3 is directed toward the fourth subpixel SP4, the fourth light leakage prevention layer 113 absorbs green or blue light, thereby being able to prevent light leakage. The fourth light leakage prevention layer 113 selectively allows red light to pass therethrough, thereby being able to absorb light generated by the second subpixel SP2 or the third subpixel SP3.

In addition, the first light leakage prevention layer 110 can absorb a green or blue leakage light component generated by the second subpixel SP2 or the third subpixel SP3 and the second light leakage prevention layer 111 can absorb a red or blue leakage light component generated by the first subpixel SP1 or the third subpixel SP3, while the third light leakage prevention layer 112 can absorb a red or green leakage light component generated by the first subpixel SP1 or the second subpixel SP2.

Although the fourth light leakage prevention layer 113 has been illustrated as allowing the same color of light to pass therethrough as the color of light that the first light leakage prevention layer 110 allows to pass therethrough in the above-described configuration, the organic light-emitting display device according to the first exemplary embodiment is not limited thereto. Rather, the color of light that the fourth light leakage prevention layer 113 allows to pass therethrough may be the same as the color of light that the second or third light leakage prevention layer 111 or 112 allows to pass therethrough.

Since light generated by different subpixels or different pixels is absorbed by the light leakage prevention layers as described above, light leakage from the organic light-emitting display device including a plurality of microlenses can be prevented or reduced.

In addition, the first to fourth light leakage prevention layers 110 to 113 are not limited thereto. Here, the color(s) of light that at least one light leakage prevention layer of the first to fourth light leakage prevention layers 110 to 113 allows to pass therethrough may be complementary to the colors of light that the other light leakage prevention layers of the first to fourth light leakage prevention layers 110 to 113 allow to pass therethrough.

For example, the first light leakage prevention layer 110, the second light leakage prevention layer 111, and the third light leakage prevention layer 112 may allow different colors of light to pass therethrough, while the fourth light leakage prevention layer 113 may allow a color or colors of light complementary to the color of light passing through one of the first to third light leakage prevention layers 110, 111, and 112 to pass therethrough.

Specifically, the fourth light leakage prevention layer 113 may allow a wavelength range of light complementary to green light to pass therethrough. In other words, the fourth light leakage prevention layer 113 may allow a color of light (or a wavelength range of light) corresponding to coordinates (0.35, 0.1) to (0.55, 3) in the 1931 CIE-xy color coordinate system to pass therethrough.

With this configuration, the fourth light leakage prevention layer 113 can prevent or reduce light leakage between different subpixels or different pixels by absorbing red, green, or blue light leakage components generated by the first to third subpixels SP1, SP2, and SP3. In particular, the fourth light leakage prevention layer 113 allows a wavelength range of light corresponding to coordinates (0.35, 0.1) to (0.55, 3) in the 1931 CIE-xy color coordinate system to pass therethrough while absorbing the other colors of light, thereby minimizing light leakage.

Since the fourth light leakage prevention layer 113 allows a wavelength range of light corresponding to coordinates (0.35, 0.1) to (0.55, 3) in the 1931 CIE-xy color coordinate system, the fourth light leakage prevention layer 113 can prevent or reduce the loss of light generated by the organic electroluminescent device EL disposed in the fourth subpixel SP4. In particular, since the absorption of inefficient blue and red light is minimized, the luminous efficiency of the organic electroluminescent device EL in the fourth subpixel SP1 can be prevented from being degraded by the fourth light leakage prevention layer 113.

Although the fourth light leakage prevention layer 113 of the organic light-emitting display device according to the first exemplary embodiment has been described as being configured to allow a wavelength range of light complementary to green light to pass therethrough, the fourth light leakage prevention layer 113 of the organic light-emitting display device according to the first exemplary embodiment is not limited thereto and may be configured to allow a wavelength range of light complementary to red or blue light to pass therethrough.

As described above, the organic light-emitting display device according to the first exemplary embodiment can prevent or reduce light leakage between different subpixels or different pixels, since the first to fourth light leakage prevention layers 110 to 113 are disposed in areas of the first to fourth subpixels SP1 to SP4, corresponding to the first to fourth light-emitting areas EA11, EA21, EA31, and EA41.

In addition, the organic light-emitting display device according to the first exemplary embodiment can prevent or reduce light leakage between different subpixels or different pixels while preventing the luminous efficiency of the organic electroluminescent device from being degraded, since the fourth light leakage prevention layer 113 allows a color of light (or a wavelength range of light) corresponding to coordinates (0.35, 0.1) to (0.55, 3) in the 1931 CIE-xy color coordinate system to pass therethrough.

Figure 4:
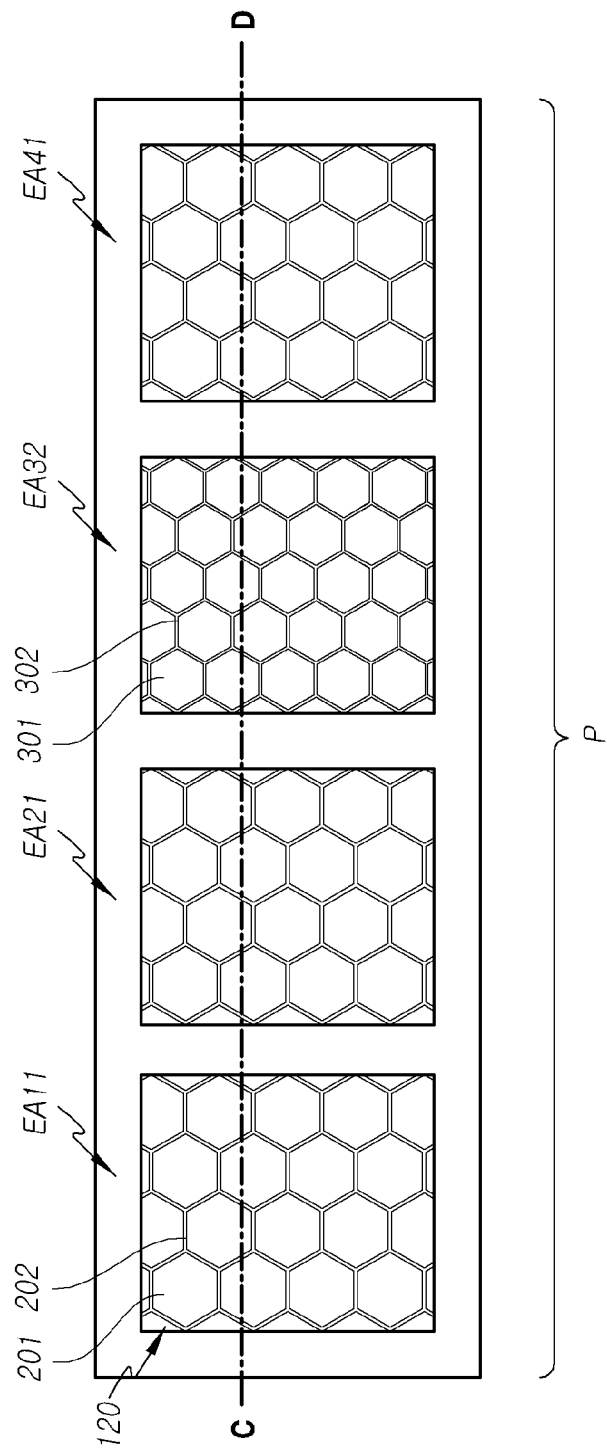
FIG. 4 is a plan view illustrating an organic light-emitting display device according to a second exemplary embodiment.

Hereinafter, an organic light-emitting display device according to a second exemplary embodiment will be described with reference to FIG. 4 and FIG. 5. FIG. 4 is a plan view illustrating the organic light-emitting display device according to the second exemplary embodiment.

The organic light-emitting display device according to the second exemplary embodiment may include the same components as those of the foregoing embodiment. Descriptions of some components will be omitted, since they are identical to those of the foregoing embodiment. In addition, the same reference numerals or symbols will be used to designate the same or like components hereinafter.

Referring to FIG. 4, the organic light-emitting display device according to the second exemplary embodiment is substantially identical to the organic light-emitting display device according to the first exemplary embodiment, except for the shape of microlenses disposed in at least one light-emitting area.

Specifically, each of the first to fourth subpixels includes first to fourth light-emitting areas EA11, EA21, EA32, and EA41. The shape of microlenses arranged in at least one light-emitting area of the first to fourth light-emitting areas EA11, EA21, EA32, and EA41 may differ from those of microlenses arranged on the remaining light-emitting areas.

Referring to FIG. 4, first microlenses are arranged in the first, second, and fourth light-emitting areas EA11, EA21, and EA41, while second microlenses are arranged in the third light-emitting area EA32. The shape of the first microlenses may differ from that of the second microlenses.

Specifically, the first microlenses include a plurality of first recesses 201 and a plurality of first connecting portions 202, each of the first connecting portions connecting adjacent first recesses 201. The second microlenses include a plurality of second recesses 301 and a plurality of second connecting portions 302, each of the second connecting portions connecting adjacent first recesses 301.

Here, at least one of the diameter D, height H, full width half maximum (FWHM), gap G between adjacent recesses, slope S, and aspect ratio A/R of the first recesses 201 may differ from the corresponding one of the second recesses 301. The FWHM refers to the length between two recesses at the half of the maximum height. The aspect ratio A/R refers to a value obtained by dividing the height H of the recesses by the radius D/2 of the recesses.

Figure 5:
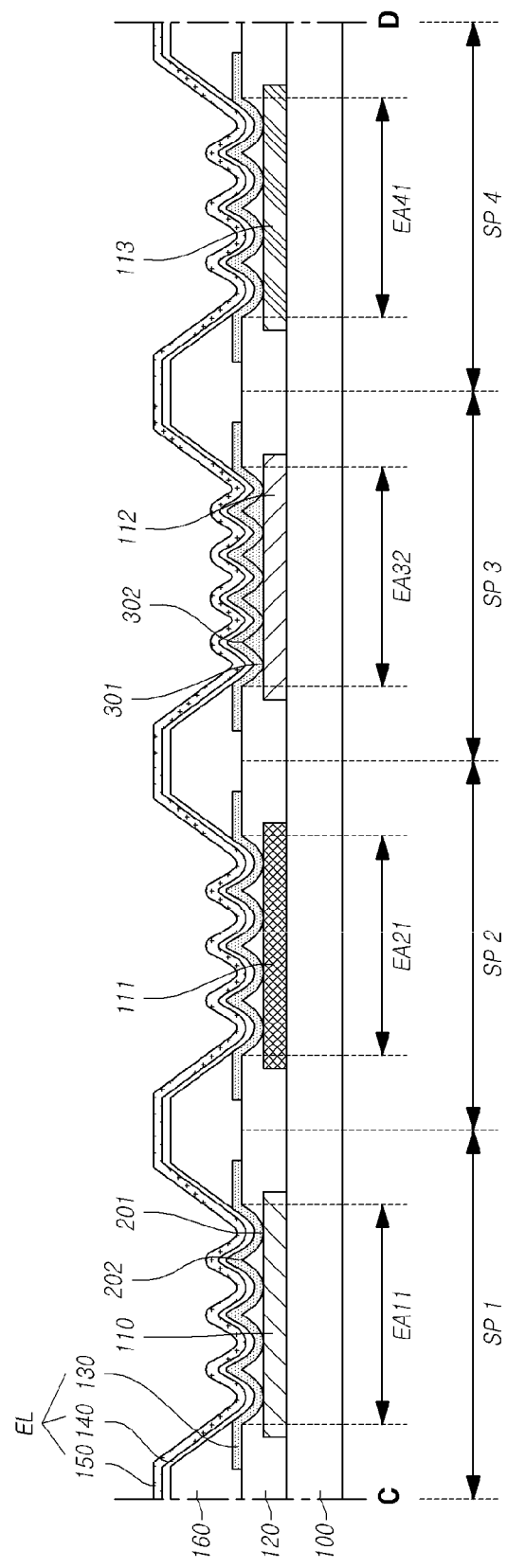
FIG. 5 is a cross-sectional view of the organic light-emitting display device according to the second exemplary embodiment, taken along line C-D in FIG. 4.

Although the diameter D2 of the second recesses 301 of the second microlenses is illustrated as being smaller than the diameter D1 of the first recesses 201 of the first microlenses in FIG. 4 and FIG. 5, the second exemplary embodiment is not limited thereto. Any configuration in which the shape of the first recesses 201 differs from that of the second recesses 301 may be employed.

This configuration will now be described in detail with reference to FIG. 5. FIG. 5 is a cross-sectional view of the organic light-emitting display device according to the second exemplary embodiment, taken along line C-D in FIG. 4. Referring to FIG. 5, the first microlenses having the same shape are arranged in the first, second, and fourth light-emitting areas EA11, EA21, and EA41. The second microlenses having a different shape from the first microlenses are arranged in the third light-emitting area EA32.

The diameter D2 of the second recesses 301 of the second microlenses may be smaller than the diameter D1 of the first recesses 201 of the first microlenses. The recesses of the microlenses are fitted into the overcoat layer 120 to improve external light extraction efficiency, and a change in the optical path depending on the shape of the recesses of the microlenses is a major factor in improvements in light extraction efficiency. Thus, optical efficiency may differ depending on the diameter D of the recesses of the microlenses.

Specifically, since the diameter D2 of the second recesses 301 of the second microlenses arranged in the third light-emitting area EA32 is smaller than the diameter D1 of the first recesses 201 of the first microlenses arranged in the first, second, and fourth light-emitting areas EA11, EA21, and EA41, the frequency at which light generated from the third light-emitting area EA32 of the organic electroluminescent device EL arrives at a third microlens structure may increase. It is thereby possible to further improve the light extraction efficiency of subpixels in which the organic electroluminescent devices EL having a low efficiency may be disposed.

In addition, since the first to fourth light leakage prevention layers 110 to 113 are disposed in the first to fourth subpixels SP1, SP2, SP3, and SP4, light leakage between different subpixels or different pixels can be prevented or reduced.

Figure 6:
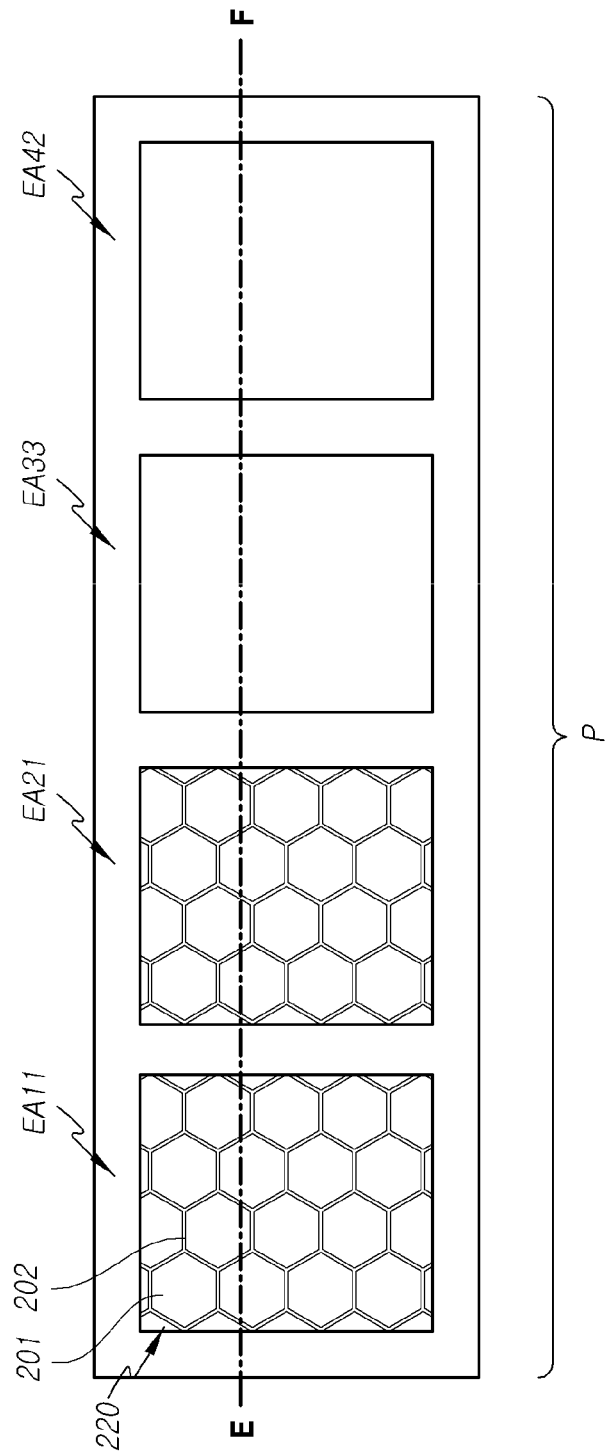
FIG. 6 is a plan view illustrating an organic light-emitting display device according to a third exemplary embodiment.

Hereinafter, an organic light-emitting display device according to a third exemplary embodiment will be described with reference to FIG. 6 and FIG. 7. FIG. 6 is a plan view illustrating the organic light-emitting display device according to the third exemplary embodiment, and FIG. 7 is a cross-sectional view of the organic light-emitting display device according to the third exemplary embodiment, taken along line E-F in FIG. 6.

The organic light-emitting display device according to the third exemplary embodiment may include the same components as those of the foregoing embodiments. Descriptions of some components will be omitted, since they are identical to those of the foregoing embodiments. In addition, the same reference numerals or will be used to designate the same or like components hereinafter.

Figure 7:
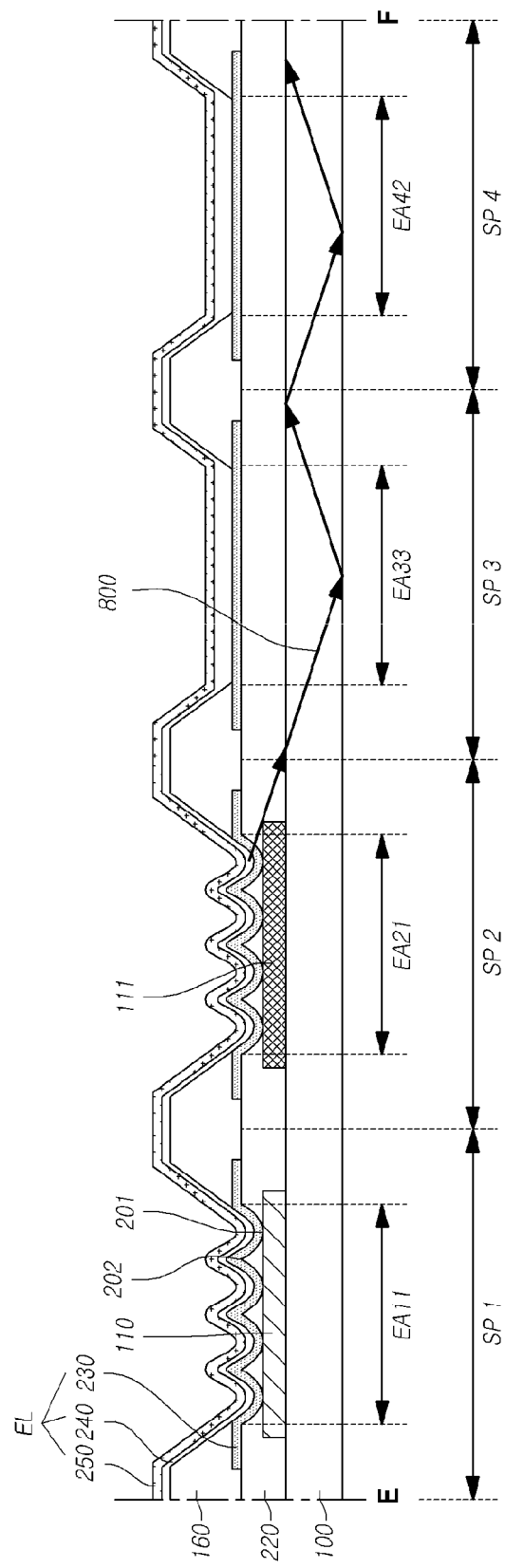
FIG. 7 is a cross-sectional view of the organic light-emitting display device according to the third exemplary embodiment, taken along line E-F in FIG. 6.

Referring to FIG. 6 and FIG. 7, in the organic light-emitting display device according to the third exemplary embodiment, at least one light-emitting area of the four light-emitting areas EA11, EA21, EA33, and EA42, included in a single pixel P, may have an area in which no light leakage prevention layer is disposed. In addition, at least one light-emitting area of the four light-emitting areas EA11, EA21, EA33, and EA42 may have an area in which no microlenses are disposed.

For example, each of the first light-emitting area EA11 and the second light-emitting area EA21 includes a light leakage prevention layer, while neither the light-emitting area EA33 nor the fourth light-emitting area EA42 includes a light leakage prevention layer. In addition, each of the first light-emitting area EA11 and the second light-emitting area EA21 includes microlenses, while neither the light-emitting area EA33 nor the fourth light-emitting area EA42 includes microlenses. That is, the light-emitting area, including an area in which no light leakage prevention layer is disposed, may not include microlenses.

The organic light-emitting display device according to the third exemplary embodiment is not limited thereto, and a light-emitting area including a light leakage prevention layer may not include microlenses.

Specifically, each of the first light-emitting area EA11 and the second light-emitting area EA21 includes a first light leakage prevention layer 110 and a second light leakage prevention layer 111. In contrast, neither the third light-emitting area EA33 nor the fourth light-emitting area EA42 includes a light leakage prevention layer.

In the first light-emitting area EA11 and the second light-emitting area EA21, the overcoat layer 220 is provided with microlenses having the same shape. In addition, in the third light-emitting area EA33 and the fourth light-emitting area EA42, the overcoat layer 220 may not be provided with microlenses.

That is, in the third light-emitting area EA33 and the fourth light-emitting area EA42, the overcoat layer 220 may be formed to be flat. Thus, a first electrode 230, an organic light-emitting layer 230, and a second electrode 250 are also formed to be flat.

Here, neither the light leakage prevention layer nor the microlenses are disposed in the fourth light-emitting area EA42. Since the microlenses are not provided in the fourth subpixel SP4 that is most vulnerable to light leakage, light leakage components generated by subpixels generating different colors of light can be prevented from being extracted by the microlenses disposed in the fourth subpixel SP4, whereby none of the light leakage components is visually perceived.

As described above, no microlenses are disposed in the fourth subpixel SP4 to prevent light leakage, thereby making it possible to omit the configuration of a light leakage prevention layer from the fourth subpixel SP4.

Although the configuration in which neither the light leakage prevention layer nor the microlenses are disposed in the third light-emitting area EA33 is illustrated in FIG. 6 and FIG. 7, the organic light-emitting display device according to the third exemplary embodiment is not limited thereto. Rather, neither the microlenses nor the light leakage prevent layer may be disposed in not only the fourth subpixel SP4 but also one of the first to third subpixels SP1, SP2, and SP3.

It is thereby possible to prevent light that would otherwise cause light leakage from being extracted outwardly through the microlenses not only in the fourth subpixel but also the other subpixels vulnerable to light leakage.

Figure 8:
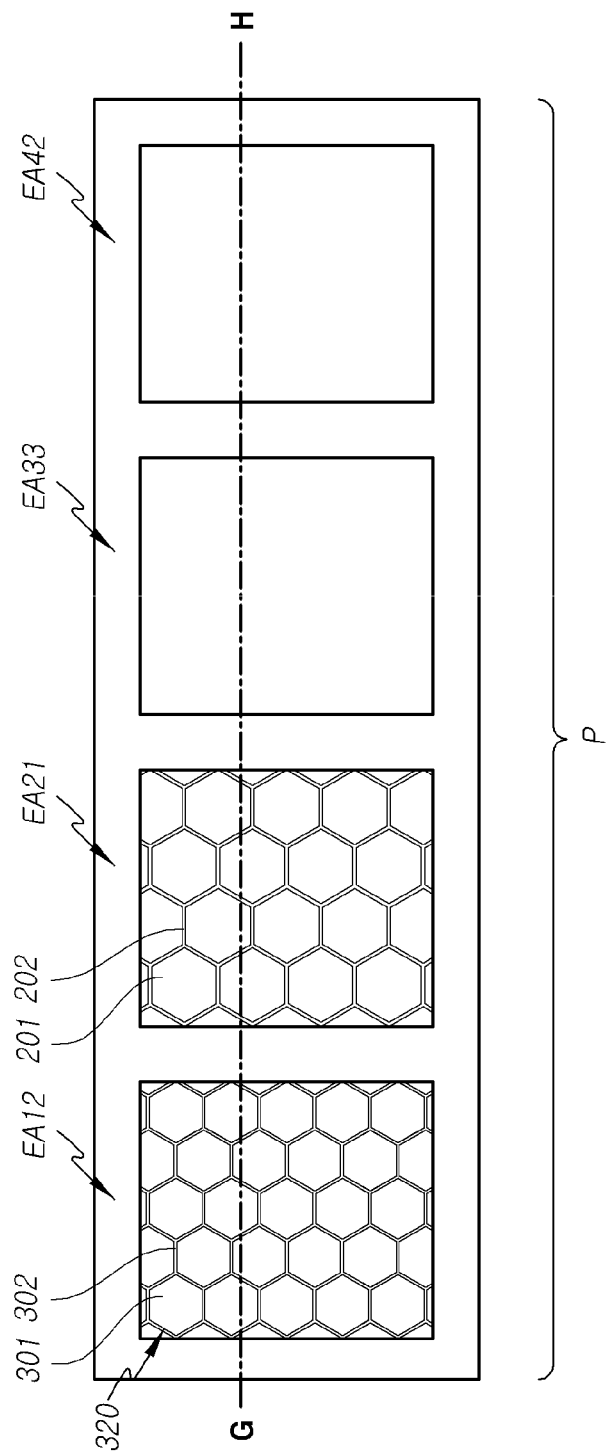
FIG. 8 is a plan view illustrating an organic light-emitting display device according to a fourth exemplary embodiment.

Hereinafter, an organic light-emitting display device according to a fourth exemplary embodiment will be described with reference to FIG. 8 and FIG. 9. FIG. 8 is a plan view illustrating the organic light-emitting display device according to the fourth exemplary embodiment, and FIG. 9 is a cross-sectional view of the organic light-emitting display device according to the fourth exemplary embodiment, taken along line G-H in FIG. 8.

The organic light-emitting display device according to the fourth exemplary embodiment may include the same components as those of the foregoing embodiments. Descriptions of some components will be omitted, since they are identical to those of the foregoing embodiments. In addition, the same reference numerals or symbols will be used to designate the same or like components hereinafter.

Figure 9:
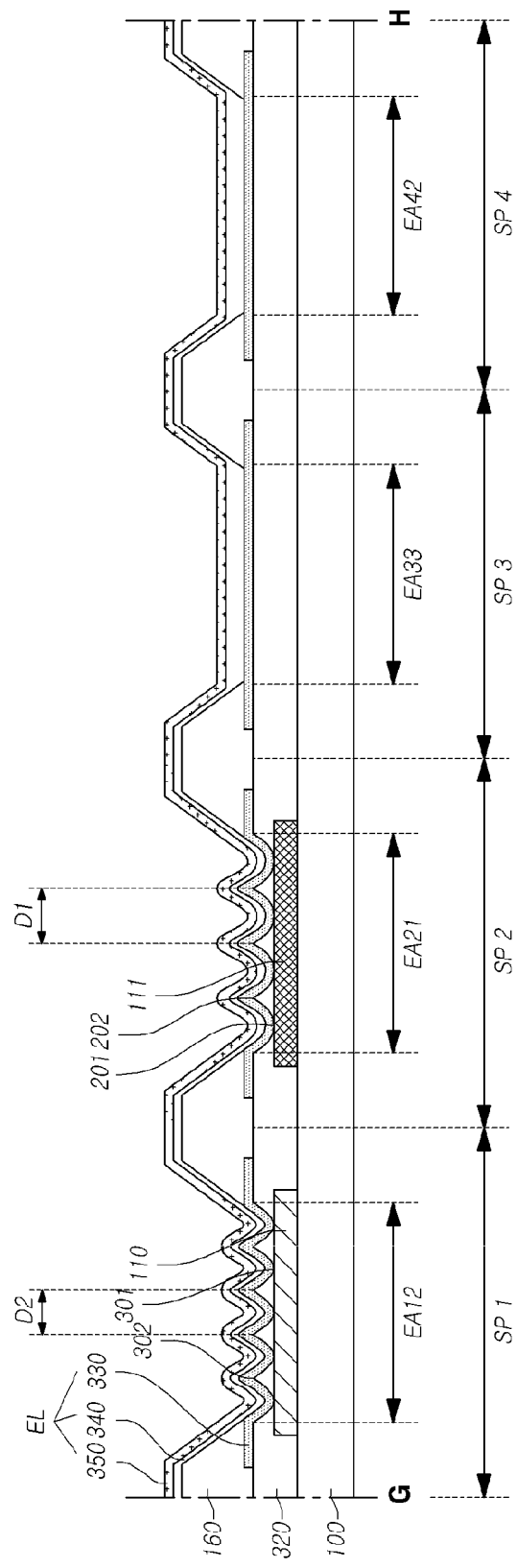
FIG. 9 is a cross-sectional view of the organic light-emitting display device according to the fourth exemplary embodiment, taken along line G-H in FIG. 8.

Referring to FIG. 8 and FIG. 9, the organic light-emitting display device according to the fourth exemplary embodiment has microlenses arranged in at least two light-emitting areas of a plurality of light-emitting areas EA12, EA21, EA33, and EA42, included in a single pixel P. The organic light-emitting display device according to the fourth exemplary embodiment differs from the organic light-emitting display device according to the third exemplary embodiment, in that the shape of the microlenses arranged in at least one light-emitting area differs from the shape of the microlenses arranged on the remaining light-emitting areas.

Specifically, the first to fourth subpixels include a first light-emitting area EA12, a second light-emitting area EA21, a third light-emitting area EA33, and a fourth light-emitting area EA42, respectively. The microlenses are arranged in at least two light-emitting areas of the first to fourth light-emitting areas EA12, EA21, EA33, and EA42. In the at least two light-emitting areas having microlenses, the shape of the microlenses arranged in one light-emitting area may differ from the shape of the microlenses arranged on another light-emitting area(s). In addition, a light leakage prevention layer and microlenses may be disposed in at least one light-emitting area.

For example, second microlenses are arranged in the first light-emitting area EA12, first microlenses are arranged in the second light-emitting area EA21, and no microlenses are arranged in the third light-emitting area EA33 and the fourth light-emitting area EA42. Here, the shape of the first microlenses may differ from the shape of the second microlenses.

Specifically, the diameter D2 of the second recesses 301 of the second microlenses disposed in the first light-emitting area EA12 is smaller than the diameter D1 of the first recesses 201 of the first microlenses. Thus, the number of the second microlenses per unit area of the first light-emitting area EA12 is greater than the number of the first microlenses per unit area of the second light-emitting area EA21.

As described above, a greater number of microlenses are arranged in the first light-emitting area EA12 in which an electroluminescent device having lower efficiency is disposed than are arranged in the second light-emitting area EA21, thereby increasing the frequency at which light generated by electroluminescent devices 330, 340, and 350 arrives at the microlenses. This can consequently increase luminous efficiency in the first light-emitting area EA12, thereby decreasing power consumption.

Figure 10:
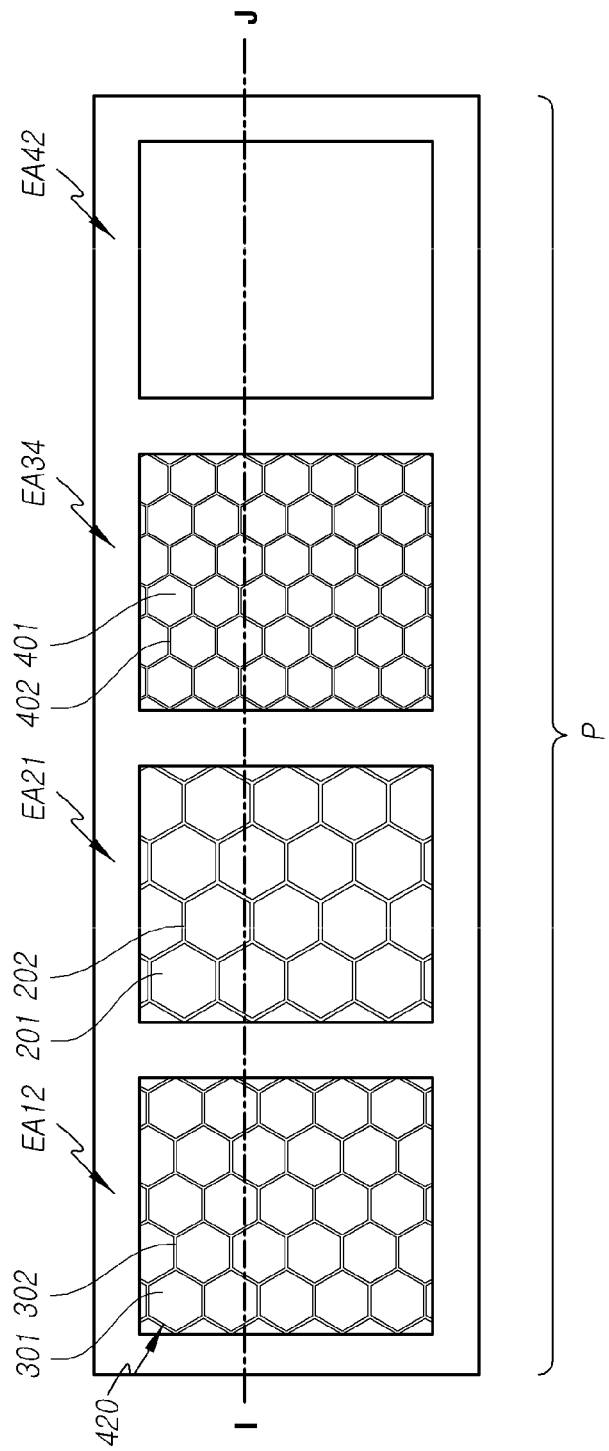
FIG. 10 is a plan view illustrating an organic light-emitting display device according to a fifth exemplary embodiment.

Hereinafter, an organic light-emitting display device according to a fifth exemplary embodiment will be described with reference to FIG. 10 and FIG. 11. FIG. 10 is a plan view illustrating the organic light-emitting display device according to the fifth exemplary embodiment, and FIG. 11 is a cross-sectional view of the organic light-emitting display device according to the fifth exemplary embodiment, taken along line I-J in FIG. 10.

The organic light-emitting display device according to the fifth exemplary embodiment may include the same components as those of the foregoing embodiments. Descriptions of some components will be omitted, since they are identical to those of the foregoing embodiments. In addition, the same reference numerals or symbols will be used to designate the same or like components hereinafter.

Figure 11:
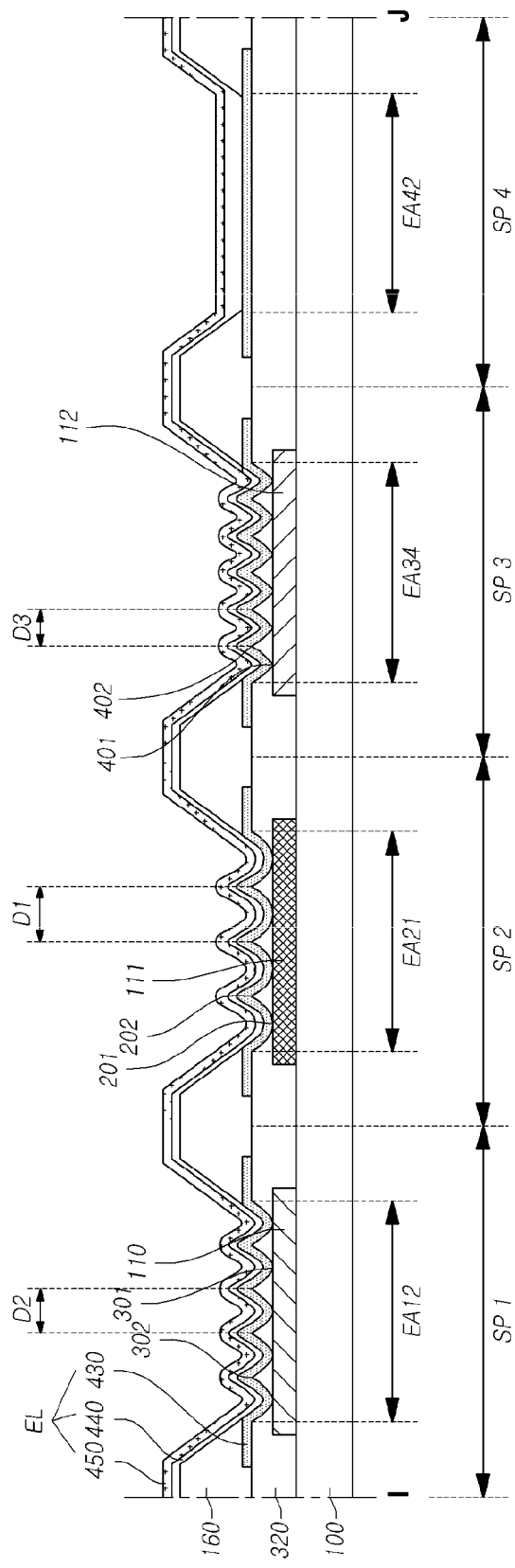
FIG. 11 is a cross-sectional view of the organic light-emitting display device according to the fifth exemplary embodiment, taken along line I-J in FIG. 10.

Referring to FIG. 10 and FIG. 11, the organic light-emitting display device according to the fifth exemplary embodiment has microlenses arranged on an overcoat layer 420 in at least three light-emitting areas of a plurality of light-emitting areas EA12, EA21, EA34, and EA42, included in a single pixel P.

The shape of the microlenses disposed in at least one light-emitting area may differ from the shape of the microlenses arranged on the remaining light-emitting areas. The shape of the microlenses disposed in at least one light-emitting area may be the same as the shape of the microlenses arranged on one light-emitting area of the remaining light-emitting areas.

In the plurality of light-emitting areas EA12, EA21, EA34, and EA42 included in the pixel P, the microlenses are disposed in at least one light-emitting area, while no microlenses are arranged on the remaining light-emitting areas.

For example, the microlenses are disposed in the first light-emitting area EA12, the second light-emitting area EA21, and the third light-emitting area EA34, while no microlenses are disposed in the fourth light-emitting area EA42.

Second microlenses, first microlenses, and third microlenses are disposed in the first light-emitting area EA12, the second light-emitting area EA21, and the third light-emitting area EA34, respectively. The shapes of the first to third microlenses are different from each other.

Specifically, the diameter D1 of first recesses 201 of the first microlenses is greater than the diameter D2 of the second recesses 301 of the second microlenses, while the diameter D2 of the second recesses 301 of the second microlenses is greater than the diameter D3 of third recesses 401 of the third microlenses.

Thus, the number of microlenses per unit area of the third light-emitting area EA34 is greater than the number of microlenses per unit area of the first light-emitting area EA12, which is greater than the number of microlenses per unit area of the second light-emitting area EA21.

The possibility that light generated by an electroluminescent device EL (430, 440, 450) in the third light-emitting area EA34 will arrive at the microlenses is higher than the possibility that light generated by an electroluminescent device EL in either the first light-emitting area EA12 or the second light-emitting area EA21 will arrive at the microlenses, while the possibility that light generated by the electroluminescent device EL in the first light-emitting area EA12 will arrive at the microlenses is higher than the possibility that light generated by the electroluminescent device EL in the second light-emitting area EA21 will arrive at the microlenses.

That is, the organic light-emitting display device according to the fifth exemplary embodiment has different shapes of microlenses depending on the efficiencies of the electroluminescent devices disposed in the light-emitting areas, whereby luminous efficiency can be improved according to the light-emitting areas.

Although the first recesses 201 of the first microlenses, the second recesses 301 of the second microlenses, and the third recesses 401 of the third microlenses have been described as having different diameters in the configuration illustrated in FIG. 10 and FIG. 11, the present disclosure is not limited thereto and may have any configuration in which at least one of the diameter, height, FWHM, gap between adjacent recesses, slope, and aspect ratio of one recess of the first to third recesses differs from a corresponding one of the other recesses.

Figure 12:
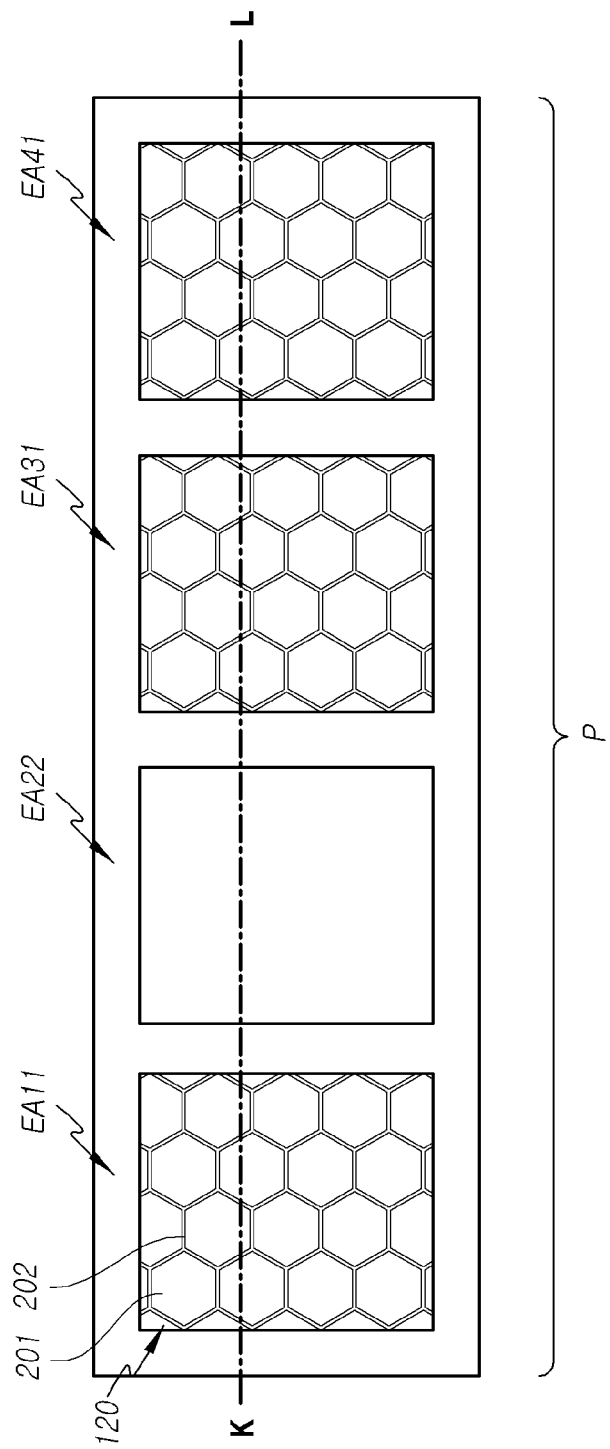
FIG. 12 is a plan view illustrating an organic light-emitting display device according to a sixth exemplary embodiment.

Hereinafter, an organic light-emitting display device according to a sixth exemplary embodiment will be described with reference to FIG. 12 and FIG. 13. FIG. 12 is a plan view illustrating the organic light-emitting display device according to the sixth exemplary embodiment, and FIG. 13 is a cross-sectional view of the organic light-emitting display device according to the sixth exemplary embodiment, taken along line K-L in FIG. 12.

The organic light-emitting display device according to the sixth exemplary embodiment may include the same components as those of the foregoing embodiments. Descriptions of some components will be omitted, since they are identical to those of the foregoing embodiments. In addition, the same reference numerals or symbols will be used to designate the same or like components hereinafter.

Figure 13:
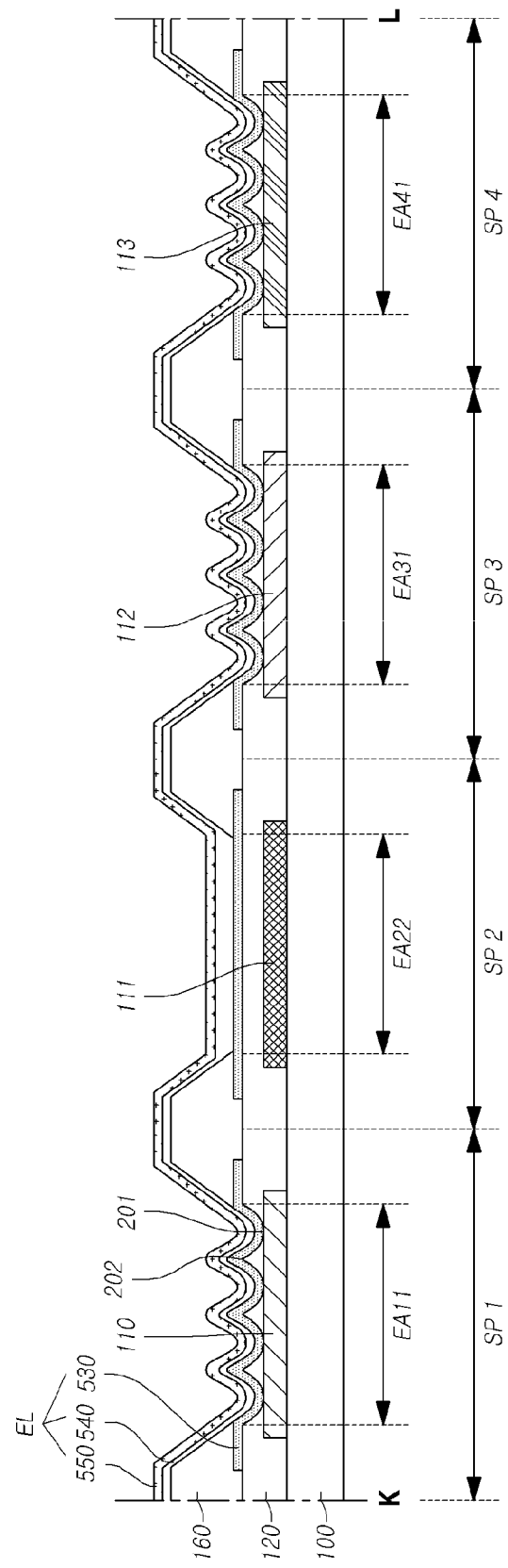
FIG. 13 is a cross-sectional view of the organic light-emitting display device according to the sixth exemplary embodiment, taken along line K-L in FIG. 12.

Referring to FIG. 12 and FIG. 13, in the organic light-emitting display device according to the sixth exemplary embodiment, a single pixel P includes a plurality of light-emitting areas EA11, EA22, EA31, and EA41, in which microlenses are arranged in the first, third, and fourth light-emitting areas EA11, EA31, and EA41, while no microlenses are arranged in the second light-emitting area EA22.

A first light leakage prevention layer 110, a second light leakage prevention layer 111, a third light leakage prevention layer 112, and a fourth light leakage prevention layer 113 are disposed on the portions of a substrate 100 corresponding to the light-emitting areas EA11, EA22, EA31, and EA41.

When an electroluminescent device EL (530, 540, 550) for generating green light is disposed in the second light-emitting area EA22, a plurality of microlenses are disposed in the light-emitting area EA11, the third light-emitting area EA31, and the fourth light-emitting area EA41, the luminous efficiency of which is lower than the luminous efficiency of the second light-emitting area EA22. It is thereby possible to improve luminous efficiency.

Figure 14:
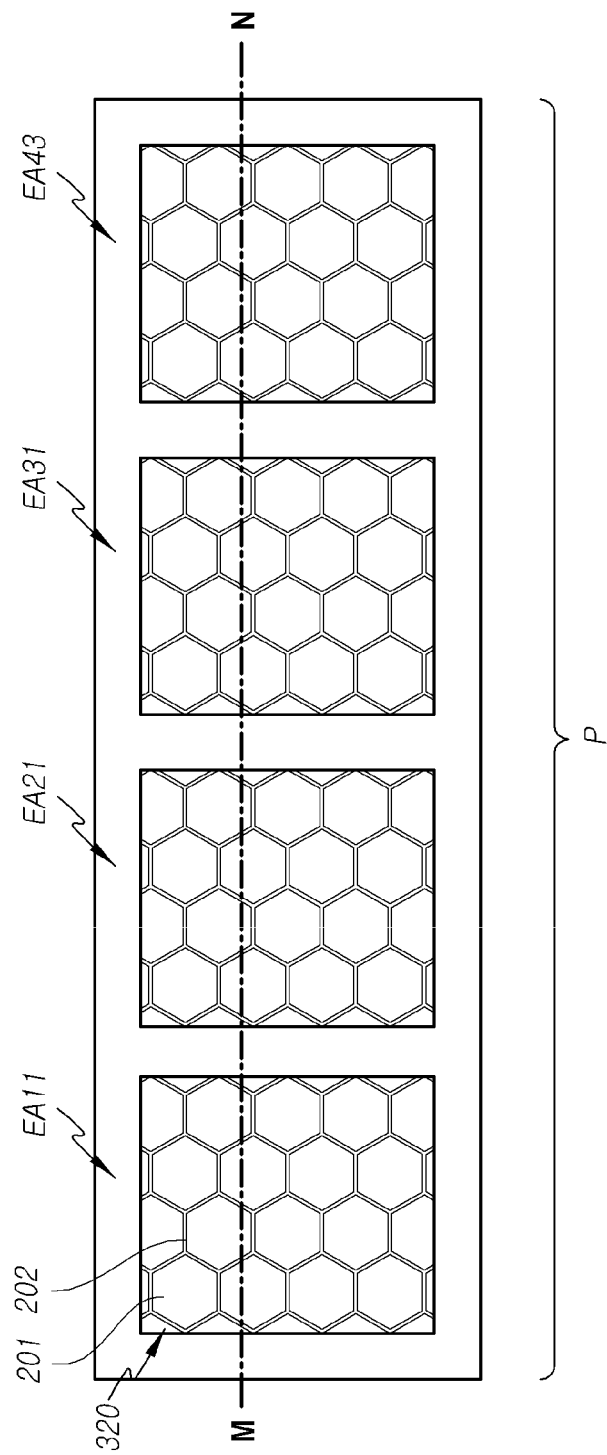
FIG. 14 is a plan view illustrating an organic light-emitting display device according to a seventh exemplary embodiment.
Figure 15:
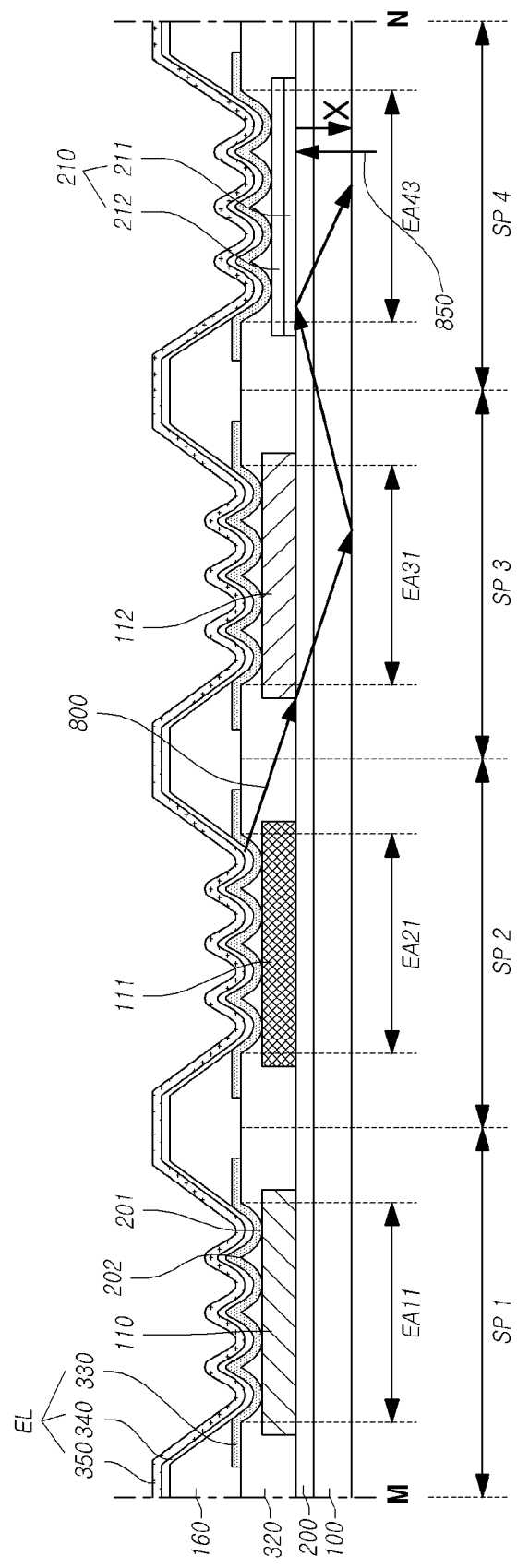
FIG. 15 is a cross-sectional view of the organic light-emitting display device according to the seventh exemplary embodiment, taken along line M-N in FIG. 14.

Hereinafter, an organic light-emitting display device according to a seventh exemplary embodiment will be described with reference to FIG. 14 and FIG. 15. FIG. 14 is a plan view illustrating the organic light-emitting display device according to the seventh exemplary embodiment, and FIG. 15 is a cross-sectional view of the organic light-emitting display device according to the seventh exemplary embodiment, taken along line M-N in FIG. 14.

The organic light-emitting display device according to the seventh exemplary embodiment may include the same components as those of the foregoing embodiments. Descriptions of some components will be omitted, since they are identical to those of the foregoing embodiments. In addition, the same reference numerals or symbols will be used to designate the same or like components hereinafter.

Referring to FIG. 14, the organic light-emitting display device according to the seventh exemplary embodiment has microlenses arranged in each of a plurality of light-emitting areas EA11, EA22, EA31, and EA43 included in a single pixel P. In addition, in a subpixel included in a single pixel P, a light leakage prevention layer may be disposed below an overcoat layer 320 including the microlenses.

In a single pixel P, a light leakage prevention layer disposed in at least one subpixel may be formed of a different material from light leakage prevention layers disposed in the other subpixels. This can consequently reduce the reflectance of a specific subpixel and reduce light leakage.

This configuration will be described with reference to FIG. 15. Referring to FIG. 15, in the organic light-emitting display device according to the seventh exemplary embodiment, a fourth light leakage prevention layer 210 disposed in at least one subpixel of a plurality of subpixels of a single pixel may be formed of a light-reflecting material. In addition, the first to third light leakage prevention layers 110, 111, and 112 disposed in the other subpixels of the plurality of subpixels of the single pixel allow red, green, and blue colors of light to pass therethrough, respectively.

Specifically, an insulating layer 200 is disposed on a substrate 100 of the organic light-emitting display device. The first to fourth light leakage prevention layers 110, 111, 112, and 210 are disposed on the portions of the insulating layer 200 corresponding to the light-emitting areas EA11, EA21, EA31, and EA43 of subpixels SP1, SP2, SP3, and SP4. The first to third light leakage prevention layers 110, 111, and 112 disposed in the first to third subpixels SP1, SP2, and SP3 allow red, green, and blue colors of light to pass therethrough, respectively. In addition, the fourth light leakage prevention layer 210 disposed in the fourth subpixel SP4 can reflect light.

The fourth light leakage prevention layer 210 disposed in the fourth subpixel SP4 may be comprised of two or more layers. Specifically, the fourth light leakage prevention layer 210 disposed in the fourth subpixel SP4 includes a first metal layer 211 disposed on the insulating layer 200 and a second metal layer 212 disposed on the first metal layer 211. Here, the insulating layer 200 may be an inorganic insulating layer formed of one selected from among, but not limited to, silicon nitride (SiNx) and silicon oxide (SiO$_2$).

Since the fourth light leakage prevention layer 210 comprised of two or more metal layers is disposed in the fourth light leakage prevention layer 210 as described above, light leakage components generated by the subpixels other than the fourth subpixel SP4 can be reflected from the first metal layer 211 or the second metal layer 212 to be redirected toward the substrate 100, thereby arriving at a polarizer (not shown) disposed below the substrate 100.

The light leakage components reflected from the first metal layer 211 or the second metal layer 212 are redirected, such that the paths thereof are different from the optical axis of the polarizer (not shown), thereby being trapped within the display device without being extracted from the substrate 100. That is, the light leakage components redirected by the first metal layer 211 or the second metal layer 212 are trapped within the display device, whereby the light leakage components are not visually perceived by viewers.

In other words, when the fourth light leakage prevention layer 210 is not disposed in the fourth subpixel SP4, light leakage components generated by the remaining subpixels may be redirected at the boundary between the substrate 100 and the polarizer (not shown) to arrive at the microlenses of the fourth subpixel SP4. Light that has arrived at the microlenses may be extracted from the substrate 100 by the microlenses, thereby causing light leakage. That is, the microlenses can convert the optical axis of light that has arrived at the microlenses to be coaxial with the optical axis of the polarizer (not shown), whereby light may be extracted from the substrate 100 to be visually perceived by viewers.

In addition, when external light 850 enters the fourth subpixel SP4 from the outside of the substrate 100, the external light 850 may be reflected from the first metal layer 211 or the second metal layer 212 to be redirected toward the substrate 100. Since the optical axis of the external light 850 changes while the external light 850 is being reflected from the first metal layer 211 or the second metal layer 212, the external light 850 fails to pass through the polarizer (not shown) disposed on the bottom surface of the substrate 100. Since the external light 805 cannot exit the display device, the reflectance of the external light 850 can be reduced.

The first metal layer 211 may be formed of a material having negative permittivity or a negative dielectric constant. The absolute value of the permittivity of the first metal layer 211 may be greater than the absolute value of the permittivity of the insulating layer 200.

The first metal layer 211 may be formed of an alkaline earth metal having negative permittivity, the absolute value of which is greater than the absolute value of the permittivity of the insulating layer 200. However, the material of the first metal layer 211 according to the present embodiment is not limited thereto. For example, the first metal layer 211 may be formed of at least one material having negative permittivity, selected from among beryllium (Be), calcium (Ca), barium (Ba), strontium (Sr), radium (Ra), lithium (Li), sodium (Na), and magnesium (Mg).

The second metal layer 212 formed of a metal is disposed on the first metal layer 211. The second metal layer 212 may be formed of at least one selected from among silver (Ag), aluminum (Al), and gold (Au).

When light arrives at the boundary between the insulating layer and the metal layer having a high permittivity, the incident light may be absorbed by the metal layer or most portions thereof may be lost due to a non-emitting plasmon mode, thereby lowering transmittance. According to the non-emitting plasmon mode, light loss is caused by electron oscillation on the surface of a metal layer acting as a reflector and the interference of wavelengths of light generated by an organic electroluminescent device, as well as absorption by the metal layer. That is, when the insulating layer and the metal layer acting as a reflector are disposed to be in contact with each other, light is lost at the boundary between the insulating layer and the metal layer, thereby reducing the transmittance.

In contrast, the first metal layer 211 disposed in the fourth subpixel SP4 has a negative permittivity that is between the permittivity of the insulating layer 200 and the permittivity of the second metal layer 212, and the absolute value of the permittivity of the first metal layer 211 is greater than the absolute value of the permittivity of the insulating layer 200. This configuration can consequently reduce the amount of light loss, thereby improving the transmittance of the fourth subpixel SP4. Thus, light generated by an electroluminescent device EL can be extracted outwardly from the substrate 100 through the fourth light leakage prevention layer 210 comprised of the first metal layer 211 and the second metal layer 212.

Specifically, since the permittivity of the first metal layer 211 is negative, the refractive index of the first metal layer 211 may be negative. More specifically, the refractive index may be represented as the square root of a product of permittivity and permeability. Since the permittivity of the first metal layer 211 is a negative value, the refractive index of the first metal layer 211 may also be a negative value.

A material having a negative refractive index allows light to pass therethrough without reflecting or absorbing incident light. In addition, the first metal layer 211 and the second metal layer 212 may be configured to be significantly thin. For example, the thickness of each of the first metal layer 211 and the second metal layer 212 may be in the range of 1 nm to 30 nm. Since the first metal layer 211 and the second metal layer 212 are formed to be thin, the transmittance of the fourth light leakage prevention layer 210 can be improved.

When light generated by the electroluminescent device EL arrives at the second metal layer 212 of the fourth light leakage prevention layer 210 through the overcoat layer 320, a portion of the light is reflected from the second metal layer 212, while the remaining portions of the light arrive at the first metal layer 211 through the second metal layer 212. As described above, the first metal layer 211 does not reflect or absorb light, such that light can be extracted outwardly from the substrate 100 through the first metal layer 211.

Consequently, due to the insulating layer 200 disposed on the substrate 100 and the first and second metal layers 211 and 212 disposed on the insulating layer 200, light leakage components and reflectance can be reduced, while transmittance of light generated by the electroluminescent device EL can be improved.

The configuration of the insulating layer 200 and the fourth light leakage prevention layer 210 disposed in the fourth subpixel SP4 is not limited to the above-described structure.

Figure 16:
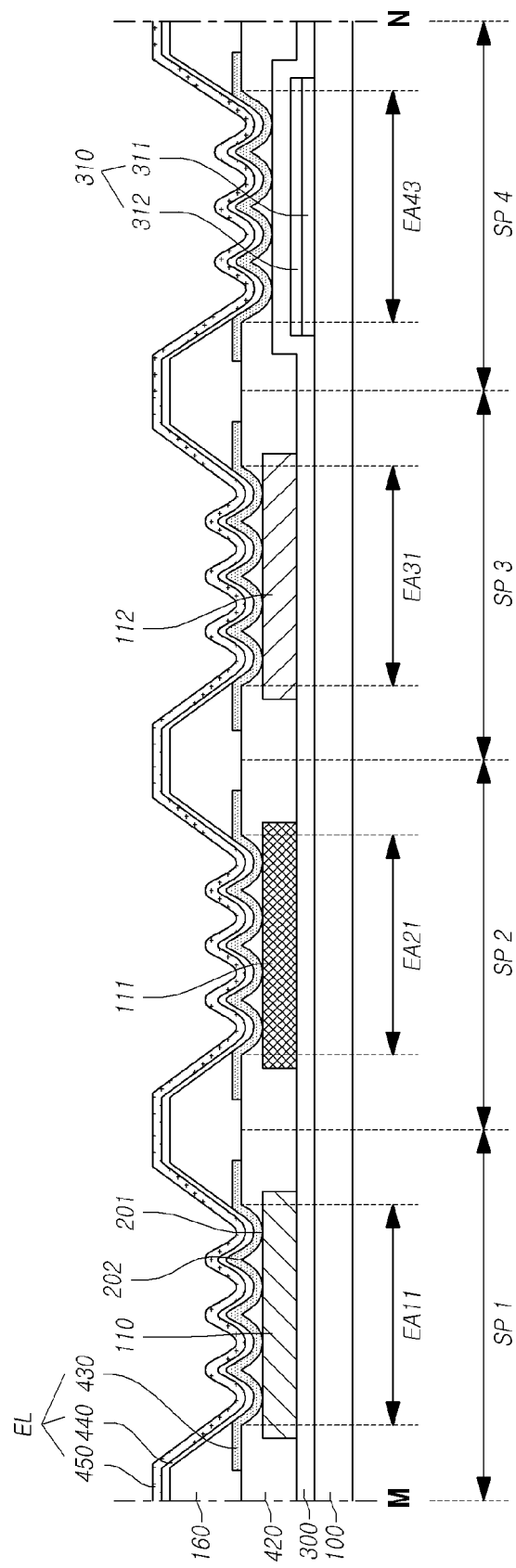
FIG. 16 illustrates a configuration of an insulating layer and a fourth light leakage prevention layer disposed in a fourth subpixel according to an alternative embodiment.

Hereinafter, an insulating layer and a fourth light leakage prevention layer disposed in a fourth subpixel according to an alternative embodiment will be described with reference to FIG. 16. FIG. 16 illustrates a configuration of the insulating layer and the fourth light leakage prevention layer disposed in the fourth subpixel according to the alternative embodiment.

Referring to FIG. 16, in the display device according to the alternative embodiment, an insulating layer 300 is disposed on the portions of a substrate 100 corresponding to first to third subpixels SP1, SP2, and SP3, and first to third light leakage prevention layers 110, 111, and 112 are disposed on the insulating layer 300.

An overcoat layer 420 including microlenses is disposed on the first to third light leakage prevention layers 110, 111, and 112 disposed in the first to third subpixels SP1, SP2, and SP3. An electroluminescent device EL including a first electrode 430, an organic light-emitting layer 440, and a second electrode 450 is disposed on the overcoat layer 420.

In addition, a fourth light leakage prevention layer 310 is disposed on the portion of the substrate 100 corresponding to a fourth subpixel SP4. The fourth light leakage prevention layer 310 includes a third metal layer 311 and a fourth metal layer 312. A portion of the insulating layer 300, formed integrally with the portions of the insulating layer 300 disposed in the first to third subpixels SP1, SP2, and SP3, is disposed on the fourth metal layer 312. That is, the insulating layer 300 to be disposed in the fourth subpixel SP4 can be formed using the process of forming the insulating layer 300 in the first to third subpixels SP1, SP2, and SP3 without any additional processing.

An overcoat layer 420 including microlenses is disposed on the insulating layer 300 of the fourth subpixel SP4, and the electroluminescent device EL including a first electrode 430, an organic light-emitting layer 440, and a second electrode 450 is disposed on the overcoat layer 420. The shapes of the first electrode 430, the organic light-emitting layer 440, and the second electrode 450 disposed in the first to fourth subpixels SP1 to SP4 may be determined based on the shapes of the microlenses disposed on the overcoat layer 420.

Each of the third metal layer 311 and the fourth metal layer 312 disposed in the fourth subpixel SP4 may be comprised of one or more layers. The third metal layer 311 may be formed of a metal. For example, the third metal layer 311 may be formed of at least one selected from among silver (Ag), aluminum (Al), and gold (Au).

The fourth metal layer 312 may be formed of an alkaline earth metal having negative permittivity, the absolute value of which is greater than the absolute value of the permittivity of the insulating layer 300. However, the material of the fourth metal layer 312 according to the present embodiment is not limited thereto. For example, the fourth metal layer 312 may be formed of at least one material having negative permittivity, selected from among beryllium (Be), calcium (Ca), barium (Ba), strontium (Sr), radium (Ra), lithium (Li), sodium (Na), and magnesium (Mg).

In addition, the third metal layer 311 and the fourth metal layer 312 may be configured to be significantly thin. For example, the thickness of each of the third metal layer 311 and the fourth metal layer 312 may be in the range of 1 nm to 30 nm. Since the third metal layer 311 and the fourth metal layer 312 are formed to be thin, the transmittance of the fourth light leakage prevention layer 310 can be improved.

As described above, in the fourth subpixel SP4, the third metal layer 311 is disposed on the substrate 100, the fourth metal layer 312 is disposed on the third metal layer 311, and the insulating layer 300 is disposed on the fourth metal layer 312. This can consequently reduce light leakage components and reflectance while improving the transmittance of light generated by the organic electroluminescent device EL.

In the organic light-emitting display device, any configuration may be used as long as the light leakage prevention layer disposed in at least one subpixel is comprised of two or more layers formed of metals, in which one metal layer having negative permittivity, the absolute value of which is greater than the absolute value of the permittivity of an insulating layer, is disposed between the insulating layer and another metal layer having a higher level of reflectance.

Figure 17:
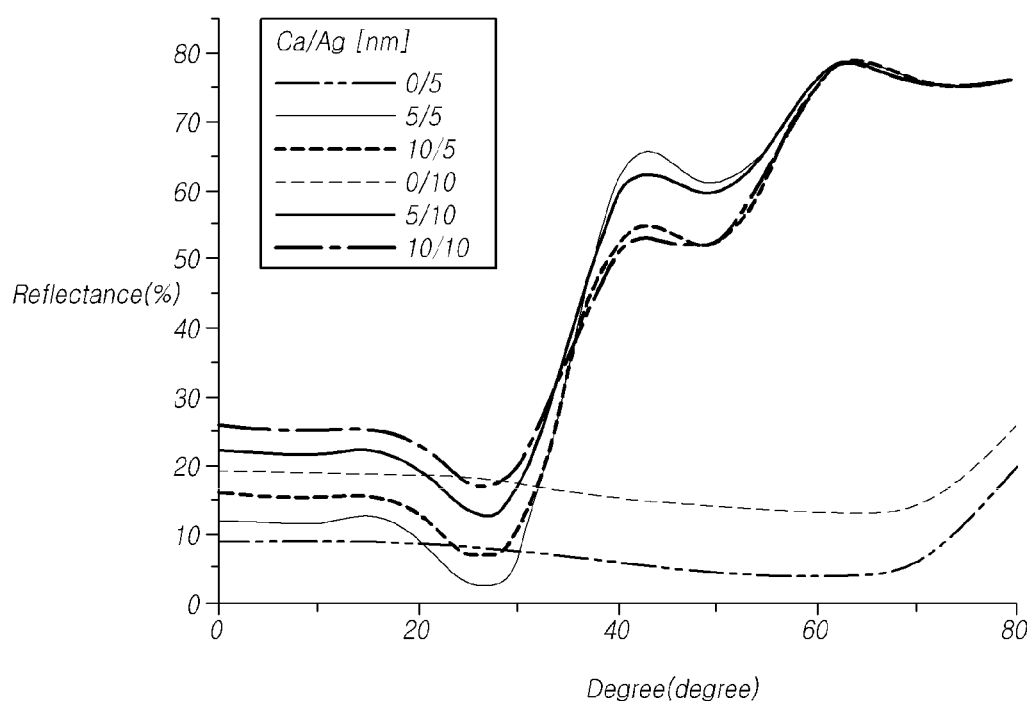
FIG. 17 is a graph illustrating the reflectance-reducing effect of organic light-emitting display devices of present examples and comparative examples.

Hereinafter, the reflectance-reducing effect of organic light-emitting display devices of present examples will be compared with the reflectance-reducing effect of organic light-emitting display devices of comparative examples. FIG. 17 is a graph illustrating the reflectance-reducing effect of organic light-emitting display devices of present examples and comparative examples.

Referring to FIG. 17, the organic light-emitting display devices in each of which only a single metal layer having a high level of reflectance is disposed as a light leakage prevention layer (comparative examples) will be compared with the organic light-emitting display devices in each of which a light leakage prevention layer includes a first metal layer and a second metal layer stacked on each other, the first metal layer having negative permittivity, the absolute value of which is greater than the absolute value of the permittivity of an insulating layer in contact with the light leakage prevention layer, and the second metal layer having a higher level of reflectance (present examples).

In FIG. 17, the x axis indicates the angle of incidence of external light to an organic light-emitting display device, and the y axis indicates the reflectance of the organic light-emitting display device. The metal layer having a higher level of reflectance was formed of silver (Ag), and the metal layer having negative permittivity, the absolute value of which is greater than the absolute value of the permittivity of an insulating layer in contact with the light leakage prevention layer, was formed of calcium (Ca).

In an organic light-emitting display device having microlenses, when external light is incident at a high angle (e.g., an angle of 40° or higher), the external light is diffused by the microlenses to be visually perceived by viewers. It is therefore desirable to prevent external light incident to the organic light-emitting display device from exiting the display device by changing the optical axis of the external light using the light leakage prevent layer or the like, as in the above-described embodiments.

However, as illustrated in FIG. 17, when external light is incident at a high angle (e.g., an angle of 40° or higher) to the organic light-emitting display devices, it is appreciated that the organic light-emitting display devices of comparative examples, including 5 nm and 10 nm light leakage prevention layers formed of only silver (Ag) (i.e., the lines corresponding to 0/5 and 0/10 Ca/Ag, respectively), reflect about 5% to about 30% of external light. This means that the ratio of the optical axis of external light incident to the display devices different from the optical axis of the polarizer is only about 5% to about 30%.

In contrast, it is appreciated that the organic light-emitting display devices of present examples including light leakage prevention layers, in which calcium (Ca) and silver (Ag) are layered at a thickness of 5 nm to 10 nm, respectively, reflect about 50% to about 80% of external light incident at a high angle. This means that the ratio of the optical axis of external light incident to the display devices different from the optical axis of the polarizer is about 50% to about 80%.

As described above, it is appreciated that each light leakage prevention layer of the organic light-emitting display devices of present examples reflects a greater amount of external light than each light leakage prevention layer of the organic light-emitting display devices of comparative examples. That is, an increase in the amount of external light reflected from the light leakage prevention layer provided in each of the organic light-emitting display devices of present example causes the optical axis of external light to differ from the optical axis of the polarizer, thereby reducing the amount of light exiting the display device. This can consequently reduce the reflectance of external light.

According to the present disclosure as set forth above, the organic light-emitting display device includes a light leakage prevention layer disposed in an area corresponding to a light-emitting area in at least one subpixel of a plurality of subpixels to prevent or reduce light leakage between different subpixels or different pixels while preventing the extraction efficiency of light generated by an organic luminescent (EL) device from being reduced.

In addition, in the organic light-emitting display device according to the present disclosure, each of a plurality of pixels a plurality of subpixels, in which the plurality of subpixels include different microlenses or at least one subpixel of the plurality of subpixels is not provided with microlenses, whereby light extraction efficiency can be adjusted depending on the subpixels and light leakage can be prevented.

The features, structures, and effects described in the present disclosure are included in at least one embodiment but are not necessarily limited to a particular embodiment. A person skilled in the art can apply the features, structures, and effects illustrated in the particular embodiment to another embodiment by combining or modifying such features, structures, and effects. It should be understood that all such combinations and modifications are included within the scope of the present disclosure.

Although the exemplary embodiments of the present disclosure have been described for illustrative purposes, a person skilled in the art will appreciate that various modifications and applications are possible without departing from the essential characteristics of the present disclosure. For example, the specific components of the exemplary embodiments may be variously modified.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light-emitting display device comprising:
a substrate;
a plurality of subpixels formed on the substrate, the subpixels generating different colors of light;
a light leakage prevention layer disposed on at least one subpixel of the plurality of subpixels;
an overcoat layer disposed on the light leakage prevention layer and including microlenses having a plurality of curved portions;
an organic electroluminescent device disposed on the overcoat layer; and
a bank pattern disposed on the overcoat layer and configured to define a light-emitting area, wherein the light leakage prevention layer corresponds to the light-emitting area.

2. The organic light-emitting display device according to claim 1, wherein
the plurality of subpixels includes red, green, blue, and white subpixels, and
the light leakage prevention layer includes first to fourth light leakage prevention layers, each of the first to fourth light leakage prevention layers corresponding to a light-emitting area of a respective subpixel of the plurality of subpixels, at least one light leakage prevention layer of the first to fourth light leakage prevention layers being thinner than the other light leakage prevention layers of the first to fourth light leakage prevention layers.

3. The organic light-emitting display device according to claim 2, wherein at least two light leakage prevention layers of the first to fourth light leakage prevention layers allow a same color of light to pass therethrough.

4. The organic light-emitting display device according to claim 2, wherein at least one light leakage prevention layer of the first to fourth light leakage prevention layers allows at least one color of light to pass therethrough that is complementary to at least one color of light that is allowed to pass through at least one other light leakage prevention layer of the first to third light leakage prevention layers.

5. The organic light-emitting display device according to claim 2, wherein the microlenses include first microlenses corresponding to a first subpixel of the plurality of subpixels and second microlenses corresponding to a second subpixel of the plurality of subpixels, the second microlenses being identical to or different from the first microlenses.

6. The organic light-emitting display device according to claim 5, wherein the first and second microlenses differ in at least one of a diameter, a height, a full width half maximum, a slope, an aspect ratio and a distance between adjacent microlenses.

7. The organic light-emitting display device according to claim 5, wherein the microlenses further include third microlenses corresponding to a third subpixel of the plurality of subpixels, the third microlenses being different from at least one of the first microlenses and the second microlenses.

8. The organic light-emitting display device according to claim 7, wherein the third microlenses differ from the at least one of the first microlenses and the second microlenses in at least one of a diameter, a height, a full width half maximum, a slope, an aspect ratio and a distance between adjacent microlenses.

9. The organic light-emitting display device according to claim 1, wherein the plurality of subpixels include red, green, blue, and white subpixels, the light leakage prevention layer being not disposed in at least one subpixel of the red, green, blue, and white subpixels.

10. The organic light-emitting display device according to claim 9, wherein the microlenses are not disposed in the at least one subpixel of the red, green, blue, and white subpixels in which the light leakage prevention layer is not disposed.

11. The organic light-emitting display device according to claim 10, wherein the at least one subpixel of the red, green, blue, and white subpixels in which neither the light leakage prevention layer nor the microlenses are disposed is the white subpixel.

12. The organic light-emitting display device according to claim 1, wherein the microlenses are not disposed in at least one subpixel of the plurality of subpixels.

13. The organic light-emitting display device according to claim 1, wherein the light leakage prevention layer disposed in the at least one subpixel of the plurality of subpixels includes first and second metal layers.

14. The organic light-emitting display device according to claim 13, further comprising:
an insulating layer disposed on the substrate,
wherein the first metal layer is disposed on the insulating layer and includes one or more layers, and the second metal layer is disposed on the first metal layer and includes one or more layers.

15. The organic light-emitting display device according to claim 14, wherein a permittivity of the first metal layer is negative, an absolute value of the permittivity of the first metal layer being greater than an absolute value of a permittivity of the insulating layer.

16. The organic light-emitting display device according to claim 14, wherein the second metal layer is formed of at least one selected from the group consisting of silver, aluminum, and gold, and the first metal layer is formed of at least one selected from the group consisting of beryllium, calcium, barium, strontium, radium, lithium, sodium, and magnesium.

17. The organic light-emitting display device according to claim 13, further comprising:
an insulating layer disposed on the second metal layer,
wherein the first metal layer is disposed on the substrate in the at least one subpixel of the plurality of subpixels and the second metal layer is disposed on the first metal layer.

18. The organic light-emitting display device according to claim 17, wherein a permittivity of the second metal layer is negative, an absolute value of the permittivity of the second metal layer being greater than an absolute value of a permittivity of the insulating layer.

19. The organic light-emitting display device according to claim 17, wherein the first metal layer is formed of at least one selected from the group consisting of silver, aluminum, and gold, and the second metal layer is formed of at least one selected from the group consisting of beryllium, calcium, barium, strontium, radium, lithium, sodium, and magnesium.

20. The organic light-emitting display device according to claim 17, wherein, in remaining subpixels of the plurality of subpixels other than the at least one subpixel, the insulating layer is disposed on the substrate, and the light leakage prevention layer is disposed on the insulating layer,
wherein a portion of the insulating layer disposed in the at least one subpixel is formed integrally with remaining portions of the insulating layer disposed in the remaining subpixels.

21. A method, comprising:
forming a plurality of subpixels on a substrate;
forming a light leakage prevention layer on at least one subpixel of the plurality of subpixels;
forming an overcoat layer over the light leakage prevention layer;
forming microlenses in the overcoat layer, the microlenses having a plurality of curved portions;
forming an organic electroluminescent device over the overcoat layer; and
forming a bank pattern on the overcoat layer, the bank pattern defining a light-emitting area, wherein the light leakage prevention layer corresponds to the light-emitting area.

22. The method of claim 21, wherein forming the light leakage prevention layer comprises:
forming first, second, third and fourth light leakage prevention layers, each of the first, second, third and fourth light prevention layers corresponding to a respective light-emitting area of a respective subpixel of the plurality of subpixels, at least one light leakage prevention layer of the first, second, third and fourth light leakage prevention layers being thinner than at least one other of the first, second, third and fourth light leakage prevention layers.

* * * * *